United States Patent
Fuji et al.

(10) Patent No.: US 8,184,410 B2
(45) Date of Patent: May 22, 2012

(54) MAGNETORESISTIVE ELEMENT HAVING FREE LAYER MAGNETIC COMPOUND EXPRESSED BY M1M2O

(75) Inventors: Yoshihiko Fuji, Kawasaki (JP); Hideaki Fukuzawa, Kawasaki (JP); Hiromi Yuasa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 955 days.

(21) Appl. No.: 11/902,657

(22) Filed: Sep. 24, 2007

(65) Prior Publication Data

US 2008/0204943 A1    Aug. 28, 2008

(30) Foreign Application Priority Data

Sep. 28, 2006  (JP) ................ P2006-265550

(51) Int. Cl.
*G11B 5/39* (2006.01)
*G11C 11/16* (2006.01)
(52) U.S. Cl. .................. 360/324.12; 365/158
(58) Field of Classification Search .......... None
See application file for complete search history.

(56) References Cited

U.S. PATENT DOCUMENTS

| | | | |
|---|---|---|---|
| 5,715,121 A | 2/1998 | Sakakima et al. | |
| 6,013,365 A | 1/2000 | Dieny et al. | |
| 6,175,477 B1 * | 1/2001 | Lin et al. | 360/324.12 |
| 6,303,218 B1 | 10/2001 | Kamiguchi et al. | |
| 6,348,274 B1 | 2/2002 | Kamiguchi et al. | |
| 6,452,763 B1 | 9/2002 | Gill | |
| 6,519,117 B1 * | 2/2003 | Gill | 360/324.12 |
| 6,556,390 B1 | 4/2003 | Mao et al. | |
| 6,567,246 B1 | 5/2003 | Sakakima et al. | |
| 6,686,068 B2 | 2/2004 | Carey et al. | |
| 6,770,382 B1 | 8/2004 | Chang et al. | |
| 6,853,520 B2 | 2/2005 | Fukuzawa et al. | |
| 6,882,509 B2 | 4/2005 | Chang et al. | |
| 6,937,446 B2 | 8/2005 | Kamiguchi et al. | |
| 7,116,529 B2 | 10/2006 | Yoshikawa et al. | |
| 7,196,877 B2 | 3/2007 | Yoshikawa et al. | |
| 7,223,485 B2 | 5/2007 | Yuasa et al. | |
| 7,301,733 B1 | 11/2007 | Fukuzawa et al. | |
| 7,331,100 B2 | 2/2008 | Li et al. | |
| 7,390,529 B2 | 6/2008 | Li et al. | |

(Continued)

FOREIGN PATENT DOCUMENTS

JP     2001-237471     8/2001

(Continued)

OTHER PUBLICATIONS

Hideaki Fukuzawa et al., "MR Ratio Enhancement by NOL Current-Confined-Path Structures in CPP Spin Valves", IEEE Transactions on Magnetics, Jul. 2004, vol. 40, No. 4, pp. 2236-2238.

(Continued)

*Primary Examiner* — Craig A. Renner
(74) *Attorney, Agent, or Firm* — Nixon & Vanderhye, P.C.

(57) ABSTRACT

An example magnetoresistive element includes a first magnetic layer whose magnetization direction is substantially pinned toward one direction; a second magnetic layer whose magnetization direction is changed in response to an external magnetic field; and a spacer layer provided between the first magnetic layer and the second magnetic layer. At least one of the first magnetic layer and the second magnetic layer has a magnetic compound that is expressed by $M1_aM2_bX_c$ (where $5 \leq a \leq 68$, $10 \leq b \leq 73$, and $22 \leq c \leq 85$). M1 is at least one element selected from the group consisting of Co, Fe, and Ni. M2 is at least one element selected from the group consisting of Ti, V, Cr, and Mn. X is at least one element selected from the group consisting of N, O, and C.

9 Claims, 13 Drawing Sheets

U.S. PATENT DOCUMENTS

| | | | |
|---|---|---|---|
| 2002/0034094 A1* | 3/2002 | Saito et al. | 365/158 |
| 2002/0048127 A1 | 4/2002 | Fukuzawa et al. | |
| 2002/0048128 A1 | 4/2002 | Kamiguchi et al. | |
| 2002/0051380 A1 | 5/2002 | Kamiguchi et al. | |
| 2003/0011463 A1 | 1/2003 | Iwasaki et al. | |
| 2003/0123200 A1 | 7/2003 | Nagasaka et al. | |
| 2004/0021990 A1 | 2/2004 | Koui et al. | |
| 2004/0190204 A1 | 9/2004 | Yoshikawa et al. | |
| 2004/0201929 A1 | 10/2004 | Hashimoto et al. | |
| 2005/0264952 A1 | 12/2005 | Oshima | |
| 2005/0264953 A1 | 12/2005 | Oshima et al. | |
| 2006/0034022 A1 | 2/2006 | Fukuzawa et al. | |
| 2006/0181814 A1 | 8/2006 | Koui et al. | |
| 2008/0074799 A1 | 3/2008 | Ishiwata | |

FOREIGN PATENT DOCUMENTS

| | | |
|---|---|---|
| JP | 2002-76473 | 3/2002 |
| JP | 2002-150512 | 5/2002 |
| JP | 2002-208744 | 7/2002 |
| JP | 2003-152243 | 5/2003 |
| JP | 2004-153248 | 5/2004 |
| JP | 2006-013430 | 1/2006 |
| JP | 2006-054257 | 2/2006 |
| WO | 2006-006420 | 1/2006 |

OTHER PUBLICATIONS

Fukuzawa et al., U.S. Appl. No. 11/199,448, filed Aug. 9, 2005.
U.S. Appl. No. 10/400,690, filed Mar. 28, 2003, Fukuzawa et al.
I.I. Mazin, "How to Define and Calculate the Degree of Spin Polarization in Ferromagnets", Physical Review Letters, vol. 83, No. 7, Aug. 16, 1999, Abstract Only.
Abstract of CN 1 431 651 dated Jul. 2003.
Office Action dated Apr. 19, 2011 in JP 2006-265550 and English-language translation thereof.

* cited by examiner

FIG. 17
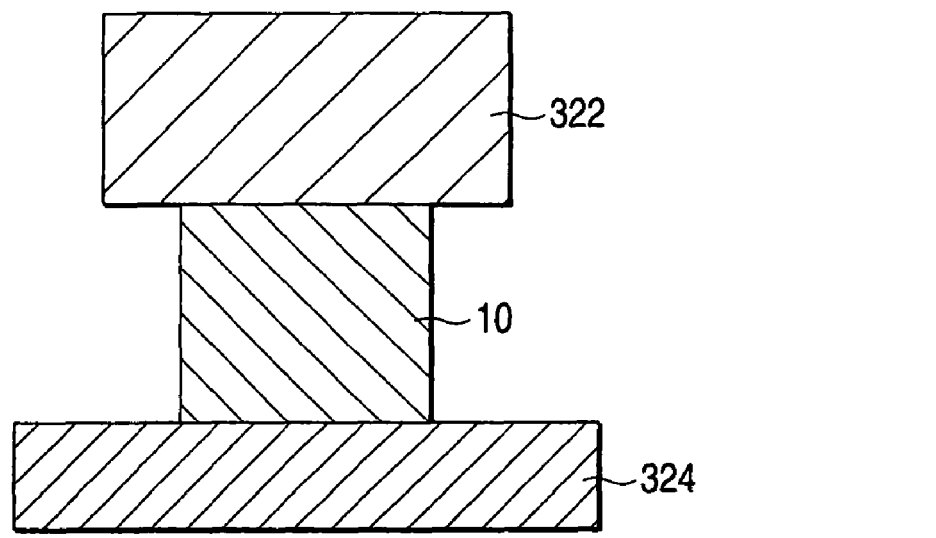
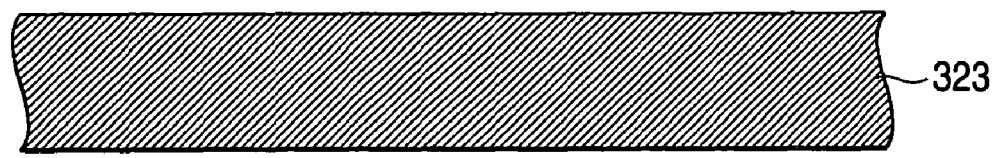

MAGNETORESISTIVE ELEMENT HAVING FREE LAYER MAGNETIC COMPOUND EXPRESSED BY M1M2O

RELATED APPLICATION(S)

The present disclosure relates to the subject matter contained in Japanese Patent Application No. 2006-265550 filed on Sep. 28, 2006, which is incorporated herein by reference in its entirety.

FIELD

The present invention relates to a magnetoresistive element, a magnetic memory having the magnetoresistive element, a magnetic head, and a magnetic recording/reproducing apparatus.

BACKGROUND

Nowadays a miniaturization and a higher recording density of the HDD (Hard Disk Drive) are proceeding rapidly, and an increase in recording density is expected much more in the future. An increase in recording density of HDD can be implemented by narrowing a width of the recording track to enhance a track density. However, when a track width is narrowed, a magnitude of recorded magnetization, i.e., amplitude of a recording signal, becomes small and thus an improvement in a reproducing sensitivity of the MR head (Magnetoresistive head) that reproduces a medium signal is required.

Recently the GMR head including a high-sensitivity spin valve film utilizing the GMR (Giant Magneto-Resistance effect) is employed. The spin valve film is a stacked film having such a sandwich structure that a non-magnetic spacer layer is put between two ferromagnetic layers, and a portion having a stacked film structure to produce a change in resistance is called a spin-dependent scattering unit. The magnetizing direction of one ferromagnetic layer (referred to as a "pin layer" or a "magnetization pinning layer" hereinafter) out of two ferromagnetic layers is fixed by the ferromagnetic layer, or the like. The magnetizing direction of the other ferromagnetic layer (referred to as a "free layer" or a "magnetization free layer" hereinafter) can be changed by the external magnetic field. In the spin valve film, a large magneto-resistance effect can be obtained by changing a relative angle of the magnetizing direction between two ferromagnetic layers.

As the magnetoresistive element using the spin valve film, there are the CIP (Current In Plane)-GMR element, the CPP (Current Perpendicular to Plane)-GMR element, and the TMR (Tunneling Magneto-Resistance) element. In the CIP-GMR element, a sense current is fed in parallel with a surface of the spin valve film. In the CPP-GMR element and the TMR element, a sense current is fed in the almost perpendicular direction to the surface of the spin valve film.

In the type that a current is fed perpendicularly to the film surface, a metal layer is used as the spacer layer in the normal CPP-GMR element, and an insulating layer is used as the spacer layer in the TMR element.

In the future, when a miniaturization of the magnetoresistive element is advanced with the increase in density of the magnetic head or the MRAM device, a higher MR ratio is required of the magnetoresistive element.

In order to improve the magneto-resistance effect, it is important to increase a spin-dependent scattering factor of the magnetization pinning layer and the magnetization free layer.

SUMMARY

It is therefore one of objects of the present invention to provide a magnetoresistive element having a high MR ratio, and a magnetic head, a magnetic recording/reproducing apparatus, and a magnetic memory using such magnetoresistive element.

According to a first aspect of the invention, there is provided a magnetoresistive element including: a first magnetic layer whose magnetization direction is substantially pinned toward one direction; a second magnetic layer whose magnetization direction is changed in response to an external magnetic field; and a spacer layer provided between the first magnetic layer and the second magnetic layer. At least one of the first magnetic layer and the second magnetic layer has a magnetic compound that is expressed by $M1_aM2_bX_c$ (where $5 \leq a \leq 68$, $10 \leq b \leq 73$, and $22 \leq c \leq 85$). M1 is at least one element selected from the group consisting of Co, Fe, and Ni. M2 is at least one element selected from the group consisting of Ti, V, Cr, and Mn. X is at least one element selected from the group consisting of N, O, and C.

According to a second aspect of the invention, there is provided a magnetoresistive element including: a first magnetic layer whose magnetization direction is substantially pinned toward one direction; a second magnetic layer whose magnetization direction is changed in response to an external magnetic field; and a spacer layer provided between the first magnetic layer and the second magnetic layer. At least one of the first magnetic layer and the second magnetic layer has a stacked structure configured by at least one of ferromagnetic thin film layers and at least one of magnetic compound layers. The magnetic compound layers have a magnetic compound expressed by $M1_aM2_bX_c$ (where $5 \leq a \leq 68$, $10 \leq b \leq 73$, and $22 \leq c \leq 85$) as a main component. M1 is at least one element selected from the group consisting of Co, Fe, and Ni. M2 is at least one element selected from the group consisting of Ti, V, Cr, and Mn. X is at least one element selected from the group consisting of N, O, and C.

According to a third aspect of the invention, there is provided a magnetoresistive head including the magnetoresistive element according to one of the first and second aspects.

According to a fourth aspect of the invention, there is provided a magnetic recording/reproducing apparatus including: the magnetoresistive head according to the third aspect; and a magnetic recording medium.

According to a fifth aspect of the invention, there is provided a magnetic memory including the magnetoresistive element according to one of the first and second aspects.

BRIEF DESCRIPTION OF THE DRAWINGS

In the accompanying drawings:

FIG. 17 is a sectional view taken along an XVII-XVII line shown in FIG. 16.

DETAILED DESCRIPTION OF THE EMBODIMENTS

Figure 1:
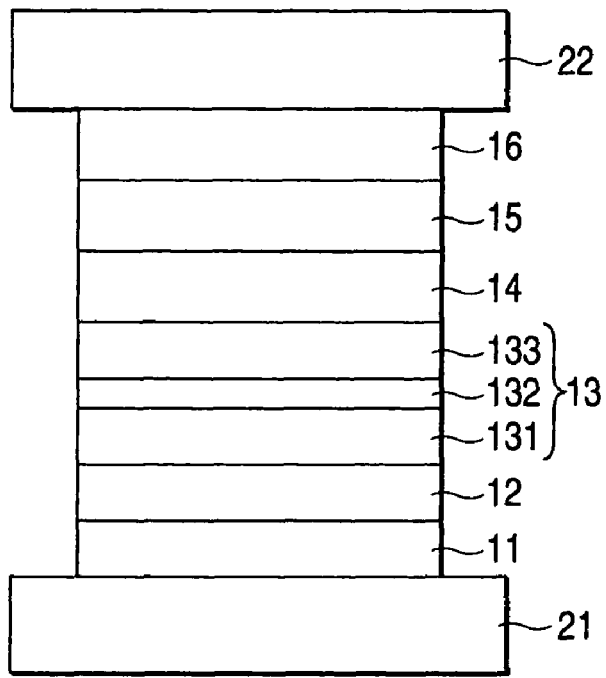
FIG. 1 is a sectional view of a magnetoresistive film of first to fourth examples according to an embodiment of the present invention.

Hereinafter, an embodiment according to the present invention will be explained in detail with reference to the accompanying drawings. In the following description, the same reference numerals are affixed to the same portions in the following explanation, and their redundant explanation will be omitted herein.

In the embodiment, new material of the magnetic compound is arranged in at least one layer of the magnetization pin layer (simply referred to as "pin layer") and the magnetization free layer (simply referred to as "free layer") of the magnetoresistive film. As the new material of the magnetic compound contained in the free layer and the pin layer of the magnetoresistive film, the magnetic compound expressed by a formula $M1_a M2_b X_c$ is employed, wherein M1 is at least one type of magnetic 3d transition metal element selected from Co, Fe, Ni, M2 is at least one type of non-magnetic 3d transition metal element selected from Ti, V, Cr, Mn, X is at least one type of nonmetallic element selected from N, O, C, and $5 \leq a \leq 68$, $10 \leq b \leq 73$, and $22 \leq c \leq 85$. Since the above magnetic compound has high spin polarizability, the spin-dependent scattering effect is large and the high MR ratio is obtained.

The reason why the above magnetic compound has the high spin polarizability is given as follows. Since the non-magnetic 3d transition metal element has an electronic structure similar to that of the magnetic 3d transition metal element, such metal element is ready to have a weak magnetism. When the non-magnetic 3d transition metal element and the magnetic 3d transition metal element are bonded together, their band structures are changed mutually and thus a magnetism of the non-magnetic 3d transition metal element appears more conspicuously. Therefore, not only the magnetic 3d transition metal element but also the non-magnetic 3d transition metal element contributes to a spin-dependent conduction. Also, when the nonmetallic element is bonded to the above metallic element, a change in band structure of the non-magnetic 3d transition metal element and the magnetic 3d transition metal element can be encouraged. As a result, the band structures of the non-magnetic 3d transition metal element and the magnetic 3d transition metal element near the Fermi surface are changed, and the high spin polarizability can be obtained.

When an added amount of a composition ratio "b" of the non-magnetic 3d transition metal element Ti, V, Cr, Mn is too small in the magnetic compound expressed by the formula $M1_a M2_b X_c$, a contribution of the non-magnetic 3d transition metal element to the spin-dependent conduction is reduced. Therefore, it is preferable that the composition ratio "b" should be set to $10 \leq b$. However, when an added amount is too large, the magnetic 3d transition metal element is reduced relatively, and the bonding between the non-magnetic 3d transition metal element and the magnetic 3d transition metal element is reduced. Thus, a magnetism of the non-magnetic 3d transition metal element is weakened. Therefore, it is more preferable that the composition ratio "b" should be set to $10 \leq b \leq 73$.

In order to obtain an effect of encouraging a change of the band structures of the non-magnetic 3d transition metal element and the magnetic 3d transition metal element, desirably a composition ratio "c" of the nonmetallic element N, O, C in the magnetic compound expressed by the formula $M1_a M2_b X_c$ should be set to $22 \leq c$. However, when an added amount is too large, the non-magnetic 3d transition metal element and the magnetic 3d transition metal element are reduced relatively, and then an amount of elements to bear the spin-dependent conduction is reduced. Therefore, it is desirable that the composition ratio "c" should be set to $22 \leq c \leq 85$. In addition, in order to obtain the large spin polarizability in a situation that this element is bonded to most of the elements contained in the non-magnetic 3d transition metal element and the magnetic 3d transition metal element, more preferably the composition ratio "c" should be set to $30 \leq c \leq 75$.

When an added amount of a composition ratio "a" of the magnetic 3d transition metal element Co, Fe, Ni is too small in the magnetic compound expressed by the formula $M1_a M2_b X_c$, the bonding between the non-magnetic 3d transition metal element and the magnetic 3d transition metal element is reduced. Thus, a magnetism of the non-magnetic 3d transition metal element is weakened. However, when an added amount is too large, the composition ratio "b" of the non-magnetic 3d transition metal element and the composition ratio "c" of the nonmetallic element are reduced relatively, and then an effect of increasing the spin polarizability due to the addition of the non-magnetic 3d transition metal element and the nonmetallic element, as already described, is weakened. Therefore, it is more desirable that the composition ratio "a" should be set to $5 \leq a \leq 68$.

As the crystal structure of the magnetic compound, sometimes such crystal structure is amorphous in a composition range of the formula $M1_a M2_b X_c$, especially a composition range of $30 \leq c \leq 75$ within which the MR ratio is high. Since the spin-dependent scattering surface becomes smooth when the crystal structure becomes amorphous, the spin-dependent scattering effect is further enhanced and accordingly a higher MR ratio can be obtained.

As a film thickness of the layer in which the magnetic compound expressed by the formula $M1_a M2_b X_c$ is contained, it is desirable that the film thickness should be thinned, particularly should be set to 5 nm or less, from a viewpoint that a gap length of the spin valve film is shortened and a viewpoint that a resistance value is increased unnecessarily. In contrast, since the sufficient spin-dependent scattering effect cannot be obtained when the film thickness is thinned excessively, it is desirable that the film thickness should be set to 0.5 nm or more. From the above, it is desirable that the film thickness of the magnetic compound should be set to 0.5 nm or more but 5 nm or less.

As a method of manufacturing a magnetic compound layer, an M1-M2-X magnetic compound layer can be manufactured by forming a film made of M1-M2 alloy material by the sputter and then causing it to react in an X element atmosphere. Also, the M1-M2-X magnetic compound layer may be manufactured by stacking films of pure M1 material and pure M2 material by the sputter and then causing them to react in an X element atmosphere. The film(s) may be caused to react in the X element atmosphere while irradiating simultaneously the ion beam of a rare gas such as Ar, or the like or the plasma. According to this method, the stable magnetic compound can be manufactured. Also, the film(s) may be formed by the sputter while using an M1-M2-X target.

The magnetic layer containing the magnetic compound may have a single layer of magnetic compound or a stacked structure of a magnetic compound layer and a ferromagnetic thin layer. When the stacked structure is formed, the conventional ferromagnetic material can be employed as the ferromagnetic thin layer. When the magnetic compound layer is employed as the free layer, a magnetic field responsibility can be improved by attacking a soft magnetic film that is superior in the soft magnetic characteristic to the magnetic compound layer. Also, the magnetic compound layer is employed as the pin layer, the pin characteristic can be improved by stacking a film made of the material that is pinned more easily in one direction.

FIRST EXAMPLE

Examples of the present invention will be explained with reference to the drawings hereinafter.

FIG. 1 is a sectional view of a magnetoresistive element according to a first example of the embodiment according to the present invention.

The magnetoresistive element in FIG. 1 includes a lower electrode 21, a under layer 11, a pinning layer 12, a pin layer 13, a spacer layer 14, a free layer 15, a cap layer 16, and an upper electrode 22, which are formed sequentially from the bottom on a substrate. Out of them, the pin layer 13, the spacer layer 14, and the free layer 15 correspond to a spin valve film (spin-dependent scattering unit) that is formed by putting the spacer layer 14 between two ferromagnetic layers.

In the first example, a synthetic spin valve structure is given, and the magnetic compound expressed by the formula $M1_aM2_bX_c$ is employed as an upper pin layer 133 of the pin layer 13 located on the spacer side and the free layer 15. In the first example, Co—Ti—O whose composition ratio is changed is employed as the formula $M1_aM2_bX_c$.

Herein, each of the layers of the magnetoresistive element will be described.

The lower electrode 21 is the electrode that feeds current to the magnetoresistive film in the direction perpendicular to the film surface. When a voltage is applied between the lower electrode 21 and the upper electrode 22, sense current flows through the magnetoresistive film in the direction perpendicular to the film. When a change in resistance caused due to the magneto-resistance effect is sensed by this sense current, magnetic field from Medium is sensed. As the lower electrode 21, a metal layer whose electric resistance is relatively small is employed to feed a current to the magnetoresistive film.

As the under layer 11, a film made of Ta [5 nm]/Ru [2 nm] is formed on the lower electrode 21. Ta layer is a buffer layer that lessens a roughness of the lower electrode. Ru layer is a seed layer that controls the crystal orientation and the crystal particle size of the spin valve film formed thereon.

As the buffer layer, Ti, Zr, Hf, V, Cr, Mo, W or their alloy material may be employed instead of Ta. It is desirable that a film thickness of the buffer layer should be set to 1 nm to 5 nm. When the buffer layer is too thin, a buffer effect is lost. In contrast, when the buffer layer is too thick, an increase in the series resistance is caused undesirably when a sense current is fed in the perpendicular direction.

As the seed layer, preferably a material having an hcp structure (hexagonal close-packed structure) or an fcc structure (face-centered cubic structure) should be employed. When Ru is employed as the seed layer, the crystal orientation of the spin valve film formed thereon can be set to fcc (111) orientation, the crystal orientation of PtMn can be set to fct (111) orientation, and the crystal orientation of the bcc structure can be set to bcc (110) orientation.

It is preferable that a film thickness of the seed layer should be set to 2 to 6 nm. When a thickness of the seed layer is too thin, an effect of controlling the crystal orientation is lost. In contrast, when the seed layer is too thick, an increase in the series resistance is caused undesirably when a sense current is fed in the perpendicular direction.

As the pinning layer 12, $Pt_{50}Mn_{50}$[15 nm] is formed on the under layer 11. The pinning layer 12 has a function of pinning the magnetization direction of the pin layer 13 formed thereon. A too thin film thickness of the pinning layer 12 is not preferable because the pinning layer 12 does not carry out a magnetization pinning function, while a too thick film thickness of the pinning layer 12 is not preferable from a viewpoint of the narrower gap. When Pt50Mn50 is used as the pinning layer 12, a film thickness of $Pt_{50}Mn_{50}$ should be set preferably to about 8 nm to 20 nm, more preferably to 10 nm to 15 nm.

As the antiferromagnetic material used as the pinning layer 12, PdPtMn, IrMn may be listed in addition to PtMn. Since IrMn fulfills the magnetization pinning function at a thinner film thickness than PtMn or PdPtMn, such IrMn is desirable from a viewpoint of the narrower gap. When IrMn is used as the pinning layer 12, a film thickness of IrMn should be set preferably to 4 nm to 12 nm, more preferably to 5 nm to 10 nm.

The pin layer 13 is formed on the pinning layer 12. In first example, a synthetic pin layer composed of a lower pin layer 131 ($Co_{90}Fe_{10}$ [1 nm to 3 nm]), a magnetic coupling intermediate layer 132 (Ru [0.9 nm]), and the upper pin layer 133 (magnetic compound M1-M2-X) is employed as the pin layer 13.

The lower pin layer 131 is coupled to the pinning layer 12 via exchange-magnetic coupling, and has unidirectional anisotropy. The lower pin layer 131 and the upper pin layer 133 are magnetically coupled to each other via the magnetic coupling intermediate layer 132 such that their magnetization directions are set in inverse parallel with each other.

In the first example, the material of the magnetic compound M1-M2-X used as the upper pin layer 133 is formed by using Co as the magnetic metal element M1, Ti as the nonmagnetic metal element M2, and O as the nonmetal element X while changing a composition ratio.

Preferably the lower pin layer 131 should be designed such that a magnetic film thickness, i.e., (saturation magnetization Bs)×(film thickness t) (which is Bs·t product) is set almost equal to the upper pin layer 133. In the first example, a film thickness of the magnetic compound (Co—Ti—O) used as the upper pin layer 133 is fixed to 3 nm, and a film thickness of $Co_{90}Fe_{10}$ used as the lower pin layer 131 was adjusted appropriately within 1 nm to 3 nm such that the saturation magnetization of $Co_{90}Fe_{10}$ used as the lower pin layer 131 becomes equal to the magnetic film thickness of the upper pin layer 133.

From viewpoints of the unidirectional anisotropic magnetic field strength by the pinning layer 12 (PtMn) and the antiferromagnetic coupled magnetic field strength between the lower pin layer 131 and the upper pin layer 133 via Ru, preferably a film thickness of the magnetic layer used as the lower pin layer 131 should be set to about 0.5 nm to 5 nm. When a film thickness is too thin, an MR ratio is reduced. When a film thickness is too thick, it is difficult to obtain the sufficient unidirectional anisotropic magnetic field necessary for the device operation.

As the lower pin layer 131, for example, a $Co_xFe_{100-x}$ alloy (x=0 to 100), an $Ni_xFe_{100-x}$ alloy (x=0 to 100), or an alloy obtained by adding to a nonmagnetic element the above alloy can be employed.

The magnetic coupling intermediate layer (Ru layer) 132 has a function of forming a synthetic pin structure by causing the antiferromagnetic coupling in the upper and lower magnetic layers. It is preferable that a film thickness of the magnetic coupling intermediate layer 132 should be set to 0.8 nm to 1 nm. Any material except Ru may be employed if such material can cause the enough antiferromagnetic coupling in the upper and lower magnetic layers.

The upper pin layer 133 constitutes a part of the spin-dependent scattering unit. In particular, the magnetic material locating at the interface to the spacer 16 is important in contributing to the spin-dependent interfacial scattering. In present Example, Co—Ti—O [3 nm] is formed as the magnetic compound M1-M2-X while changing a composition ratio. The upper pin layer 133 containing such magnetic compound Co—Ti—O as a main component has a high spin-dependent scattering effect.

As the spacer layer 14, Cu [5 nm] is formed on the pin layer 13. As the spacer layer 14, Au, Ag, or the like may be employed in place of Cu. It is desirable that a film thickness of the spacer layer 14 should be set thicker to break the magnetic coupling between the free layer and the pin layer, and should be set to a spin scattering length or less. Therefore, the film thickness of the spacer layer 14 should be set preferably to 0.5 nm to 10 nm, more preferably to 1.5 nm to 5 nm.

As the free layer 15, the magnetic compound Co—Ti—O [3 nm] is formed on the spacer layer 14 while changing a composition ratio. The free layer 15 having such magnetic compound Co—Ti—O as a main component has a high spin-dependent scattering effect.

As the cap layer, Cu [1 nm]/Ta [5 nm] is formed on the free layer 15.

The magnetoresistive elements according to the first example are formed by using the magnetic compound Co—Ti—O [3 nm] as the upper pin layer 133 and the free layer 15 while changing a composition ratio of Co—Ti—O. Also, as a comparative example, the magneto-resistive elements are formed by using the conventional material $Co_{90}Fe_{10}$ [3 nm] as the upper pin layer 133 and the free layer 15.

As a method of forming the magnetic compound layer in the first example, a method of forming a film made of the M1-M2 alloy material by the sputter and causing it to react in an X element atmosphere was employed. The magnetic compound layer M1-M2-X may be formed by stacking films of the pure M1 material and the pure M2 material by the sputter and then causing them to react in the X element atmosphere. These films may be caused to react in the X element atmosphere while irradiating the ion beam of a rare gas such as Ar, or the like or the plasma simultaneously. According to this method, the stable magnetic compound can be formed. Also, the films may be formed by the sputter while using an M1-M2-O target.

In the first example, the magnetoresistive elements having the composition ratio given in the composition formula expressed by $CO_aTi_bO_c$ shown in following Table 1 are manufactured. (Here, "a", "b", "c" are an atomic percent [at %].) In Table 1, remarks indicating whether the MR ratio is improved in each composition rather than the comparative example or not is shown together.

TABLE 1

| sample No. | Magnetic Material | Improvement in MR ratio to Comparative Example |
| --- | --- | --- |
| (Comp. Example) A00 | $Co_{90}Fe_{10}$ | — |
| A01 | $Co_{69}Ti_{10}O_{21}$ | not improved |
| A02 | $Co_{68}Ti_{10}O_{22}$ | improved |
| A03 | $Co_{60}Ti_{10}O_{30}$ | particularly improved |
| A04 | $Co_{40}Ti_{10}O_{50}$ | particularly improved |
| A05 | $Co_{15}Ti_{10}O_{75}$ | particularly improved |
| A06 | $Co_5Ti_{10}O_{85}$ | improved |
| A07 | $Co_4Ti_{10}O_{86}$ | not improved |
| A08 | $Co_{69}Ti_9O_{22}$ | not improved |
| A09 | $Co_5Ti_{73}O_{22}$ | improved |
| A10 | $Co_4Ti_{74}O_{22}$ | not improved |
| A11 | $Co_4Ti_{66}O_{30}$ | not improved |
| A12 | $Co_4Ti_{30}O_{66}$ | not improved |
| A13 | $Co_5Ti_{65}O_{30}$ | particularly improved |
| A14 | $Co_{10}Ti_{50}O_{40}$ | particularly improved |
| A15 | $Co_{30}Ti_{30}O_{40}$ | particularly improved |
| A16 | $Co_{20}Ti_{20}O_{60}$ | particularly improved |

When the magnetoresistive element of the first example was evaluated, it was confirmed that the MR ratio higher than that in the Comparative Example was obtained by the magnetoresistive element that was manufactured at the Co—Ti—O composition ratio in a particular range. The reason for such improvement in the MR ratio can be considered such that the magnetic compound has a high spin polarizability by attaining a proper composition ratio.

The reason why the magnetic compound according to the present invention has the high spin polarizability may be considered as follows. Since the non-magnetic 3d transition metal element has the electronic structure similar to that of the magnetic 3d transition metal element, such metal element is ready to have a weak magnetism. When the non-magnetic 3d transition metal element and the magnetic 3d transition metal element are bonded together, their band structures are changed mutually and thus a magnetism of the non-magnetic 3d transition metal element appears more conspicuously. Therefore, not only the magnetic 3d transition metal element but also the non-magnetic 3d transition metal element contributes to the spin-dependent conduction. Also, when the nonmetallic element is bonded to the above metallic element, a change in band structure of the non-magnetic 3d transition metal element and the magnetic 3d transition metal element can be encouraged. As a result, the band structures of the non-magnetic 3d transition metal element and the magnetic 3d transition metal element near the Fermi surface are changed, and the high spin polarizability can be obtained.

The MR ratio of the comparative example A00 is 0.6%. It is confirmed that the magnetoresistive element manufactured in ranges of $5 \leq a \leq 68$, $10 \leq b \leq 73$, and $22 \leq c \leq 85$ has the MR ratio of 1% or more, which exceeds the comparative example. Also, the particularly high MR ratio in excess of 15% was confirmed in the magnetoresistive element manufactured in the range of $30 \leq c \leq 75$ among the above ranges. Thus, improvement in the MR ratio due to use of the magnetic compound was particularly remarkably noticed.

When an added amount of a composition ratio "b" of the non-magnetic 3d transition metal element Ti, V, Cr, Mn is too small in the magnetic compound expressed by the formula $M1_aM2_bX_c$, a contribution of the non-magnetic 3d transition metal element to the spin-dependent conduction is reduced. Therefore, it is preferable that the composition ratio "b" should be set to $10 \leq b$. However, when an added amount is too large, the magnetic 3d transition metal element is reduced relatively, and the bonding between the non-magnetic 3d transition metal element and the magnetic 3d transition metal element is reduced. Thus, a magnetism of the non-magnetic 3d transition metal element is weakened. Therefore, it is more preferable that the composition ratio "b" should be set to $10 \leq b \leq 73$.

In order to obtain an effect of encouraging a change of the band structures of the non-magnetic 3d transition metal element and the magnetic 3d transition metal element, preferably a composition ratio "c" of the nonmetallic element N, O, C in the magnetic compound expressed by the formula $M1_aM2_bX_c$ should be set to $22 \leq c$. However, when an added amount is too large, the non-magnetic 3d transition metal element and the magnetic 3d transition metal element are reduced relatively, and then an amount of elements to bear the spin-dependent conduction is reduced. Therefore, it is desirable that the composition ratio "c" should be set to $22 \leq c \leq 85$. In addition, in order to obtain the large spin polarizability in a situation that this element is bonded to most of the elements contained in the non-magnetic 3d transition metal element and the magnetic 3d transition metal element, the particularly high MR ratio can be obtained when the composition ratio "c" should be set to $30 \leq c \leq 75$.

When an added amount of a composition ratio "a" of the magnetic 3d transition metal element Co, Fe, Ni is too small in the magnetic compound expressed by the formula $M1_aM2_bX_c$, the bonding between the non-magnetic 3d transition metal element and the magnetic 3d transition metal element is reduced. Thus, a magnetism of the non-magnetic 3d transition metal element is weakened. However, when an added amount is too large, the composition ratio "b" of the non-magnetic 3d transition metal element and the composition ratio "c" of the nonmetallic element are reduced relatively, and then an effect of increasing the spin polarizability due to the addition of the non-magnetic 3d transition metal element and the nonmetallic element, as already described, is weakened. Therefore, it is more desirable that the composition ratio "a" should be set to $5 \leq a \leq 68$.

As the crystal structure of the magnetic compound, sometimes such crystal structure is amorphous in a composition range of the formula $M1_aM2_bX_c$, especially a composition range of $30 \leq c \leq 75$ within which the MR ratio is high. Since the spin-dependent scattering surface becomes smooth when the crystal structure becomes amorphous, the spin-dependent scattering effect is further enhanced and accordingly a higher MR ratio can be obtained.

As a film thickness of the layer in which the magnetic compound expressed by the formula $M1_aM2_bX_c$ is contained, it is desirable that the film thickness should be thinned, particularly should be set to 5 nm or less, from a viewpoint that a gap length of the spin valve film is shortened and a viewpoint that a resistance value is increased unnecessarily. In contrast, since the sufficient spin-dependent scattering effect cannot be obtained when the film thickness is thinned excessively, it is desirable that the film thickness should be set to 0.5 nm or more. From the above, it is desirable that the film thickness of the magnetic compound should be set to 0.5 nm or more but 5 nm or less. In present Example, a film thickness of the magnetic compound layer was set to 3 nm.

In the first example, the magnetic compound Co—Ti—O was used as the upper pin layer 133 and the free layer 15. In this case, the magnetic compound Co—Ti—O may be used as any one of the upper pin layer 133 and the free layer 15, and the conventional material may be used as the other layer. Since the spin-dependent scattering of the inserted layer is increased even when the magnetic compound is inserted into only one layer, the MR ratio can be improved.

In case the magnetic compound Co—Ti—O is used as the upper pin layer 133 and the conventional material is used as the free layer 15, $Co_{90}Fe_{10}$ [1 nm] /$Ni_{83}Fe_{17}$[3.5 nm], for example, can be used as the free layer 15. In order to obtain the high MR ratio when the conventional material is used, the selection of the magnetic material of the free layer 15 located on the interface to the spacer layer 14 is important. In this case, preferably a CoFe alloy should be provided to the interface to the spacer layer 14 rather than a NiFe alloy. When the CoFe alloy is employed in vicinity of $Co_{90}Fe_{10}$, preferably a film thickness of this alloy should be set to 0.5 nm to 4 nm. When the CoFe alloy having other composition (for example, the composition explained in connection with the pin layer 13) is employed, preferably the film thickness should be set to 0.5 nm to 2 nm. For example, in order to increase the spin-dependent interface scattering effect, such a case may be considered that $Fe_{50}Co_{50}$ (or $Fe_xCo_{100-x}$ (x=45 to 85)) having the bcc structure is used as the free layer 15. In this case, a too thick film thickness cannot be used as the free layer 15 to maintain the soft magnetism, and therefore 0.5 nm to 1 nm gives a preferable film thickness range.

Since the soft magnetic characteristic is relatively good when Fe not containing Co is used, a film thickness can be set to about 0.5 nm to 4 nm.

A NiFe layer provided on the CoFe layer is the material whose soft magnetic characteristic is stable. The soft magnetic characteristic of the CoFe alloy is not so stable. However, the soft magnetic characteristic can be complemented by providing the NiFe alloy thereon, and the high MR ratio can be obtained.

It is preferable that a composition of the NiFe alloy should be set to $Ni_xFe_{100-x}$ (x=about 78 to 85). It is preferable that a film thickness of the NiFe layer should be set to about 2 nm to 5 nm.

When the NiFe layer is not used, the free layer 15 constructed by stacking a CoFe layer or an Fe layer of 1 nm to 2 nm thick and a very thin Cu layer of about 0.1 to 0.8 nm thick in plural alternately may be employed.

When the magnetic compound layer Co—Ti—O is used as the free layer 15 and the conventional material is used as the upper pin layer 133, $\{(Fe_{50}Co_{50}$ [1 nm]/Cu [2.5 nm]) $\times 2/Fe_{50}Co_{50}$ [1 nm]$\}$, for example, can be used as the upper pin layer 133. Out of the conventional materials, when the magnetic material having the bcc structure on the interface to the spacer layer 14 is used, the high MR ratio can be realized because such material has the high spin-dependent interface scattering effect. As a FeCo-based alloy having the bcc structure, $Fe_xCo_{100-x}$ (x=30 to 100) and an alloy obtained by adding an addition element to $Fe_xCo_{100-x}$ are listed. Also, when the upper pin layer 133 is formed by the magnetic layer having the bcc structure that is ready to attain the high MR ratio, preferably a film thickness of the layer having the bcc structure should be set to 2 nm or more to keep the bcc structure more stably. In order to obtain the strong magnetization pinning magnetic field and keep a stability of the bcc structure, preferably a film thickness range of the upper pin layer 133 having the bcc structure should be set to about 2.5 nm to 4 nm.

As the upper pin layer 133, the layer obtained by stacking a magnetic layer (FeCo layer) and a nonmagnetic layer (very thin Cu layer) alternately can be employed. In the upper pin layer 133 having such structure, the spin-dependent scattering effect called the bulk scattering effect can be improved.

As the upper pin layer 133, a single-layer film made of Co, Fe, Ni, or their alloy material may be employed. For example, as the upper pin layer 133 having the simplest structure, a Co90Fe10 single layer may be employed. An element may be added to such material.

First Variation: A Single Spin Valve

Figure 2:
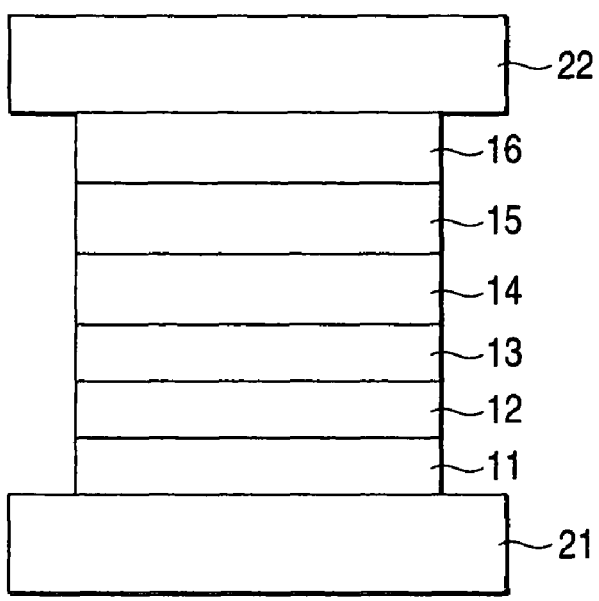
FIG. 2 is a sectional view of a magnetoresistive film according to a first variation of the first example.

As a first variation of the first example shown in FIG. 1, a magneto-resistive element whose magnetization pinning layer is formed by not a three-layered structure (synthetic structure) but a single layer is shown in FIG. 2.

As shown in FIG. 2, the magnetoresistive element according to the first variation includes the lower electrode 21, the under layer 11, the pinning layer 12, the pin layer 13, the spacer layer 14, the free layer 15, the cap layer 16, and the upper electrode 22, which are formed sequentially from the bottom on the substrate.

In the first variation, the magnetic compound M1-M2-X is employed as the single pin layer 13 and the free layer 15.

Similar to the first example, Co—Ti—O can be employed as the magnetic compound M1-M2-X. In the first variation, the similar advantages to those in first example can be obtained. As for the compositions in the magnetic compound M1-M2-X, even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

Second Variation: A Top Type Spin Valve

Figure 3:
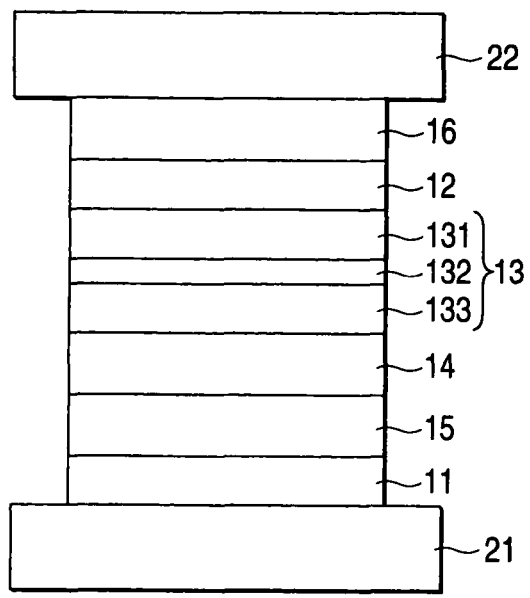
FIG. 3 is a sectional view of a magnetoresistive film according to a second variation of the first example.

As a second variation of first example shown in FIG. 1, a magnetoresistive element in which the magnetization pin layer and the magnetization free layer are positioned via the spacer layer conversely to the first example is shown in FIG. 3.

As shown in FIG. 3, the magnetoresistive element of the second variation includes the lower electrode 21, the under layer 11, the free layer 15, the spacer layer 14, the pin layer 13, the pinning layer 12, the cap layer 16, and the upper electrode 22, which are formed sequentially from the bottom on the substrate.

In the second variation, a synthetic spin valve structure is employed, and the magnetic compound M1-M2-X is employed as the lower pin layer 133 of the pin layer 13 located on the spacer side and the free layer 15.

Similar to the first example, Co—Ti—O can be employed as the magnetic compound M1-M2-X. In the second variation, the similar advantages to those in the first example can be obtained. As for the compositions in the magnetic compound M1-M2-X, even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

Third Variation: A Dual Pin Type Spin Valve

Figure 4:
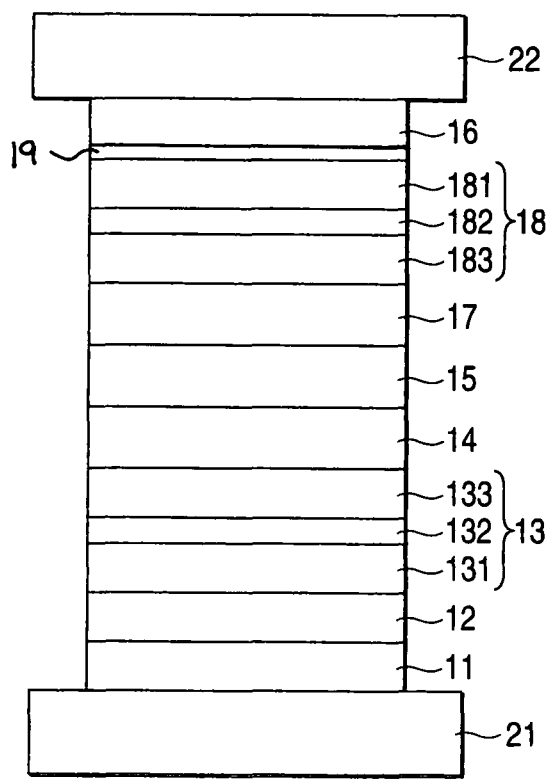
FIG. 4 is a sectional view of a magnetoresistive film according to a third variation of the first example.

As a third variation of the first example shown in FIG. 1, a dual type magnetoresistive element in which the spacer layer and the pin layer are provided on and under the free layer respectively is shown in FIG. 4.

As shown in FIG. 4, the magnetoresistive element of the third variation includes the lower electrode 21, the under layer 11, the pinning layer 12, the pin layer 13, the spacer layer 14, the free layer 15, a spacer layer 17, a pin layer 18, a pinning layer 19, the cap layer 16, and the upper electrode 22, which are formed sequentially from the bottom on the substrate.

In the third variation, a synthetic structure is employed as the pin layer 13 and the pin layer 18, and the magnetic compound M1-M2-X is employed as the upper pin layer 133 of the pin layer 13 located on the spacer side, a lower pin layer 183 of the pin layer 18 located on the spacer side, and the free layer 15. Pin layer 18 also includes an intermediate layer 182 and an upper pin layer 181.

Similar to the first example, Co—Ti—O can be employed as the magnetic compound M1-M2-X. In the third variation, the similar advantages to those in first example can be obtained. As for the compositions in the magnetic compound M1-M2-X, even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

Fourth Variation: Stacked Free Layer Structure

Figure 5:
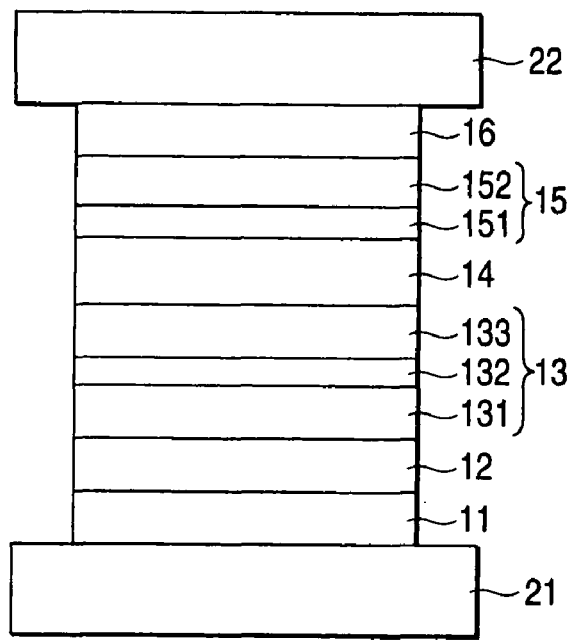
FIG. 5 is a sectional view of a magnetoresistive film according to a fourth variation of the first example.

As a fourth variation of the first example shown in FIG. 1, a magneto-resistive element in which a stacked structure composed of a magnetic compound layer and a ferromagnetic thin film layer is used as the free layer is shown in FIG. 5.

As shown in FIG. 5, a magnetoresistive element of the fourth variation includes the lower electrode 21, the under layer 11, the pinning layer 12, the pin layer 13, the spacer layer 14, the free layer 15, the cap layer 16, and the upper electrode 22, which are formed sequentially from the bottom on the substrate. In the fourth variation, the free layer 15 is formed of a stacked film composed of a lower free layer 151 and an upper free layer 152. Also, in the fourth variation, the synthetic spin valve structure is employed, and the magnetic compound layer M1-M2-X is employed as the upper pin layer 133 of the pin layer 13 located on the spacer side and the lower free layer 151.

When a soft magnetic film that is superior in the soft magnetic characteristic to the magnetic compound layer is employed as the ferromagnetic thin film layer used as the upper free layer 152, a magnetic field responsibility can be improved. A NiFe alloy can be employed as the material of the ferromagnetic thin film layer used as the upper free layer 152. $Ni_xFe_{100-x}$ (x=about 78 to 85) is preferable as the composition of the NiFe alloy, and about 2 nm to 5 nm is preferable as a film thickness of the NiFe layer. When the NiFe layer is not employed, a configuration may be employed in which the free layer obtained by stacking a CoFe layer or a Fe layer of 1 nm to 2 nm thickness and a very thin Cu layer of about 0.1 nm to 0.8 nm thickness in plural alternately. Also, $Co_{90}Fe_{10}$ whose soft magnetic characteristic is particularly stable out of the CoFe alloy may be employed. When the CoFe alloy similar to $Co_{90}Fe_{10}$ is employed, preferably a film thickness should be set to 0.5 nm to 4 nm. When the CoFe alloy having other composition is employed, preferably a film thickness should be set to 0.5 nm to 2 nm to maintain the soft magnetic characteristic.

Similar to the first example, Co—Ti—O can be employed as the magnetic compound M1-M2-X. In the fourth variation, the higher MR ratio than the conventional material can be obtained similarly to first example. As for the compositions in the magnetic compound M1-M2-X, even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

In the fourth example, the magnetic compound layer M1-M2-X is employed as the lower free layer 151 and the ferromagnetic thin film layer is employed as the upper free layer 152. But the ferromagnetic thin film layer may be employed as the lower free layer 151 and the magnetic compound layer M1-M2-X may be employed as the upper free layer 152. In case the spin-dependent scattering of the magnetic compound is considered separately as the bulk scattering and the interface scattering, sometimes such a situation is caused depending on the method of manufacturing the magnetic compound layer M1-M2-X that the spin-dependent bulk scattering becomes higher than the conventional ferromagnetic material used as the ferromagnetic thin film layer and the spin-dependent interface scattering becomes lower than the conventional ferromagnetic material used as the ferromagnetic thin film layer. In such case, only the spin-dependent bulk scattering effect of the magnetic compound layer is used effectively by arranging the ferromagnetic thin film layer on the spacer layer interface, so that the high MR ratio can be obtained. Also, in the fourth example, the two-layered stacked structure composed of the magnetic compound layer and the ferromagnetic thin film layer is employed, but a three-layered stacked structure composed of the ferromagnetic thin film layer/magnetic compound layer/ferromagnetic thin film layer, or the like may be employed.

In the fourth example, a single layer of the magnetic compound M1-M2-X is employed as the pin layer, but the conventional material may be employed. Also, in combination with fifth variation described hereunder, both magnetic layers of the free layer and the pin layer may of the stacked type.

Fifth Variation: Stacked Pin Layer Structure

Figure 6:
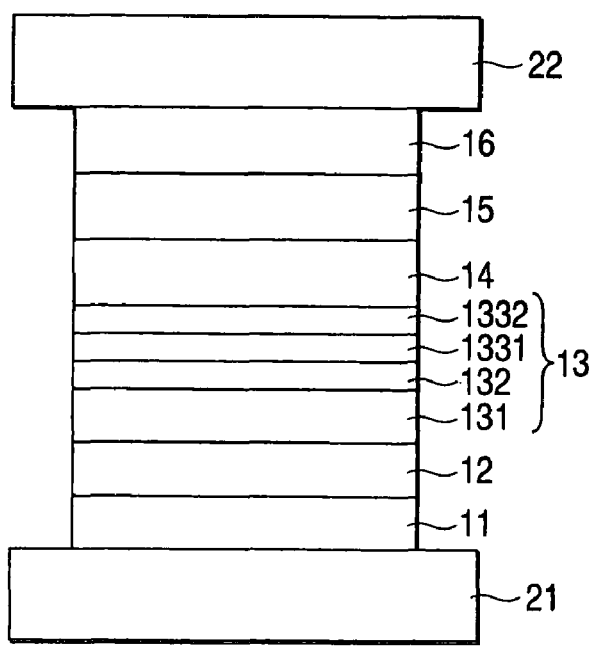
FIG. 6 is a sectional view of a magnetoresistive film according to a fifth variation of the first example.

As a fifth variation of the first example shown in FIG. 1, a magnetoresistive element in which a stacked structure composed of the magnetic compound layer and the ferromagnetic thin film layer is used as the pin layer is shown in FIG. 6.

As shown in FIG. 6, the magnetoresistive element of the fifth variation includes the lower electrode 21, the under layer 11, the pinning layer 12, the pin layer 13, the spacer layer 14, the free layer 15, the cap layer 16, and the upper electrode 22, which are formed sequentially from the bottom on the substrate. In present fifth variation, the synthetic spin valve structure is employed, and a stacked film composed of an upper pin layer lower layer 1331 and an upper pin layer upper layer 1332 is employed as the upper pin layer 133 of the pin layer 13 located on the spacer side and the magnetic compound expressed by the formula $M1_aM2_bX_c$ is employed as the upper pin layer upper layer 1332 and the free layer 15.

According to the fifth variation, because the pin layer is easily pinned in one direction by employing the stacked structure composed of the magnetic compound layer and the ferromagnetic layer as the upper pin layer 133, the pin characteristic of the pin layer can be improved. In present Variation, the ferromagnetic layer is used as the upper pin layer lower layer 1331. As the material of the ferromagnetic thin film layer used as the upper pin layer lower layer 1331, a single metal of Co, Fe, Ni, or the like, or all the alloy materials containing any one of these elements can be employed.

Similar to the first example, Co—Ti—O can be employed as the magnetic compound M1-M2-X. In the fifth variation, the higher MR ratio than the conventional material can be obtained like first example. As for the compositions in the magnetic compound M1-M2-X, even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

In the fifth example, the magnetic compound layer M1-M2-X is employed as the upper pin layer upper layer 1332 and the ferromagnetic thin film layer is employed as the upper pin layer lower layer 1331. But the ferromagnetic thin film layer may be employed as the upper pin layer upper layer 1332 and the magnetic compound layer may be employed as the upper pin layer lower layer 1331. In case the spin-dependent scattering of the magnetic compound is considered separately as the bulk scattering and the interface scattering, in some cases such a situation is caused depending on the method of manufacturing the magnetic compound layer M1-M2-X that the spin-dependent bulk scattering becomes higher than the conventional ferromagnetic material used as the ferromagnetic thin film layer and the spin-dependent interface scattering becomes lower than the conventional ferromagnetic material used as the ferromagnetic thin film layer. In such case, only the spin-dependent bulk scattering effect of the magnetic compound layer is utilized effectively by arranging the ferromagnetic thin film layer on the spacer layer interface, so that the high MR ratio can be obtained. Also, in present fifth example, the two-layered stacked structure composed of the magnetic compound layer and the ferromagnetic thin film layer is employed, but a three-layered stacked structure composed of the ferromagnetic thin film layer/magnetic compound layer/ferromagnetic thin film layer, or the like may be employed.

In the fifth example, a single layer of the magnetic compound layer M1-M2-X is employed as the free layer, but the conventional material may be employed. Also, both magnetic layers of the free layer and the pin layer may have the stacked structure composed of the magnetic compound layer and the ferromagnetic thin film layer, in combination with fifth variation described hereunder.

SECOND EXAMPLE

Next, a magnetoresistive element of a second example according to the embodiment of the present invention will be explained hereunder. The second example is different from the first example in that the material of the magnetic compound is varied. Therefore, explanation of the portions different apparently from first example will be made hereunder, but explanation of the similar portions will be omitted herein.

The magnetoresistive elements according to the second example are manufactured by using the magnetic compound Co—V—O [3 nm] as the upper pin layer 133 and the free layer 15 while changing a composition ratio of Co—V—O. Also, as a comparative example, the magnetoresistive element in which the conventional material $Co_{90}Fe_{10}$ [3 nm] is used as the upper pin layer 133 and the free layer 15 is also manufactured.

When the magnetoresistive element of the second example is evaluated, it is confirmed that the MR ratio higher than that in the Comparative Example was obtained by the magnetoresistive element that was manufactured at the Co—V—O composition ratio in a particular range. The reason for such improvement in the MR ratio can be considered such that the magnetic compound has the high spin polarizability by attaining a proper composition ratio.

In the second example, the magnetoresistive elements having the composition ratio given in the composition formula expressed by $CO_aV_bO_c$ as shown in following Table 2 are manufactured. (Here, "a", "b", "c" are an atomic percent [at %].) In Table 2, remarks indicating whether the MR ratio is improved in each composition rather than the comparative example or not is shown together.

TABLE 2

| sample No. | Magnetic Material | Improvement in MR ratio to Comparative Example |
|---|---|---|
| (Comp. Example) A00 | $Co_{90}Fe_{10}$ | — |
| B01 | $Co_{69}V_{10}O_{21}$ | not improved |
| B02 | $Co_{68}V_{10}O_{22}$ | improved |
| B03 | $Co_{60}V_{10}O_{30}$ | particularly improved |
| B04 | $Co_{40}V_{10}O_{50}$ | particularly improved |
| B05 | $Co_{15}V_{10}O_{75}$ | particularly improved |
| B06 | $Co_5V_{10}O_{85}$ | improved |
| B07 | $Co_4V_{10}O_{86}$ | not improved |
| B08 | $Co_{69}V_9O_{22}$ | not improved |
| B09 | $Co_5V_{73}O_{22}$ | improved |
| B10 | $Co_4V_{74}O_{22}$ | not improved |
| B11 | $Co_4V_{66}O_{30}$ | not improved |
| B12 | $Co_4V_{30}O_{66}$ | not improved |
| B13 | $Co_5V_{65}O_{30}$ | particularly improved |
| B14 | $Co_{10}V_{50}O_{40}$ | particularly improved |
| B15 | $Co_{30}V_{30}O_{40}$ | particularly improved |
| B16 | $Co_{20}V_{20}O_{60}$ | particularly improved |

The MR ratio of the comparative example A00 is 0.6%. It is confirmed that the magnetoresistive element manufactured in ranges of $5 \leq a \leq 68$, $10 \leq b \leq 73$, and $22 \leq c \leq 85$ has the MR ratio of 1% or more, which exceeds Comparative Example. Also, the particularly high MR ratio in excess of 15% was confirmed in the magnetoresistive element manufactured in the range of $30 \leq c \leq 75$ among the above ranges. Thus, improvement in the MR ratio due to use of the magnetic compound was particularly remarkably noticed.

When an added amount of a composition ratio "b" of the non-magnetic 3d transition metal element Ti, V, Cr, Mn is too small in the magnetic compound expressed by the formula $M1_aM2_bX_c$, a contribution of the non-magnetic 3d transition metal element to the spin-dependent conduction is reduced. Therefore, it is preferable that the composition ratio "b" should be set to $10 \leq b$. However, when an added amount is too large, the magnetic 3d transition metal element is reduced relatively, and the bonding between the non-magnetic 3d transition metal element and the magnetic 3d transition metal element is reduced. Thus, a magnetism of the non-magnetic 3d transition metal element is weakened. Therefore, it is more preferable that the composition ratio "b" should be set to $10 \leq b \leq 73$.

In order to obtain an effect of encouraging a change of the band structures of the non-magnetic 3d transition metal element and the magnetic 3d transition metal element, preferably a composition ratio "c" of the nonmetallic element N, O, C in the magnetic compound expressed by the formula $M1_aM2_bX_c$ should be set to $22 \leq c$. However, when an added amount is too large, the non-magnetic 3d transition metal element and the magnetic 3d transition metal element are reduced relatively, and then an amount of elements to bear the spin-dependent conduction is reduced. Therefore, it is desirable that the composition ratio "c" should be set to $22 \leq c \leq 85$. In addition, in order to obtain the large spin polarizability in a situation that this element is bonded to most of the elements contained in the non-magnetic 3d transition metal element and the magnetic 3d transition metal element, the particularly high MR ratio can be obtained when the composition ratio "c" should be set to $30 \leq c \leq 75$.

When an added amount of a composition ratio "a" of the magnetic 3d transition metal element Co, Fe, Ni is too small in the magnetic compound expressed by the formula $M1_aM2_bX_c$, the bonding between the non-magnetic 3d transition metal element and the magnetic 3d transition metal element is reduced. Thus, a magnetism of the non-magnetic 3d transition metal element is weakened. However, when an added amount is too large, the composition ratio "b" of the non-magnetic 3d transition metal element and the composition ratio "c" of the nonmetallic element are reduced relatively, and then an effect of increasing the spin polarizability due to the addition of the non-magnetic 3d transition metal element and the nonmetallic element, as already described, is weakened. Therefore, it is more desirable that the composition ratio "a" should be set to $5 \leq a \leq 68$.

In the second example, as for the compositions in the magnetic compound formula $M1_aM2_bX_c$, Co was employed as M1, V was employed as M2, and O was employed as X. Even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

In the second example, variations of the film structure similar to the first to fifth variations of the first example can be applied.

THIRD EXAMPLE

Next, a magnetoresistive element of a third example according to the embodiment of the present invention will be explained hereunder. The third example is different from the first example in that the material of the magnetic compound is varied. Therefore, explanation of the portions different apparently from first example will be made hereunder, but explanation of the similar portions will be omitted herein.

In the third example, the magnetoresistive elements are manufactured by using the magnetic compound Co—Cr—O [3 nm] as the upper pin layer 133 and the free layer 15 while changing a composition ratio of Co—Cr—O. Also, as a comparative example, the magnetoresistive element in which the conventional material $Co_{90}Fe_{10}$ [3 nm] is used as the upper pin layer 133 and the free layer 15 is also manufactured.

When the magnetoresistive element of the third example was evaluated, it was confirmed that the MR ratio higher than that in the comparative example was obtained by the magnetoresistive element that was manufactured at the Co—Cr—O composition ratio in a particular range. The reason for such improvement in the MR ratio can be considered such that the magnetic compound has the high spin polarizability by attaining a proper composition ratio.

In the third example, the magnetoresistive elements having the composition ratio given in the composition formula expressed by $Co_aCr_bO_c$ shown in Table 3 are manufactured. (Here, "a", "b", "c" are an atomic percent [at %].) In Table 3, remarks indicating whether the MR ratio is improved in each composition rather than the comparative example or not is shown together.

TABLE 3

| sample No. | Magnetic Material | Improvement in MR ratio to Comparative Example |
|---|---|---|
| (Comp. Example) A00 | $Co_{90}Fe_{10}$ | — |
| C01 | $Co_{69}Cr_{10}O_{21}$ | not improved |
| C02 | $Co_{68}Cr_{10}O_{22}$ | improved |
| C03 | $Co_{60}Cr_{10}O_{30}$ | particularly improved |
| C04 | $Co_{40}Cr_{10}O_{50}$ | particularly improved |
| C05 | $Co_{15}Cr_{10}O_{75}$ | particularly improved |
| C06 | $Co_5Cr_{10}O_{85}$ | improved |
| C07 | $Co_4Cr_{10}O_{86}$ | not improved |
| C08 | $Co_{69}Cr_9O_{22}$ | not improved |
| C09 | $Co_5Cr_{73}O_{22}$ | improved |
| C10 | $Co_4Cr_{74}O_{22}$ | not improved |
| C11 | $Co_4Cr_{66}O_{30}$ | not improved |
| C12 | $Co_4Cr_{30}O_{66}$ | not improved |
| C13 | $Co_5Cr_{65}O_{30}$ | particularly improved |
| C14 | $Co_{10}Cr_{50}O_{40}$ | particularly improved |
| C15 | $Co_{30}Cr_{30}O_{40}$ | particularly improved |
| C16 | $Co_{20}Cr_{20}O_{60}$ | particularly improved |

The MR ratio of the comparative example A00 is 0.6%. It is confirmed that the magnetoresistive element manufactured in ranges of $5 \leq a \leq 68$, $10 \leq b \leq 73$, and $22 \leq c \leq 85$ has the MR ratio of 1% or more, which exceeds the comparative example. Also, the particularly high MR ratio in excess of 15% is confirmed in the magnetoresistive element manufactured in the range of $30 \leq c \leq 75$ among the above ranges. Thus, improvement in the MR ratio due to use of the magnetic compound was particularly remarkably noticed.

When an added amount of a composition ratio "b" of the non-magnetic 3d transition metal element Ti, V, Cr, Mn is too small in the magnetic compound expressed by the formula $M1_aM2_bX_c$, a contribution of the non-magnetic 3d transition metal element to the spin-dependent conduction is reduced. Therefore, it is preferable that the composition ratio "b" should be set to $10 \leq b$. However, when an added amount is too large, the magnetic 3d transition metal element is reduced relatively, and the bonding between the non-magnetic 3d transition metal element and the magnetic 3d transition metal element is reduced. Thus, a magnetism of the non-magnetic 3d transition metal element is weakened. Therefore, it is more preferable that the composition ratio "b" should be set to $10 \leq b \leq 73$.

In order to obtain an effect of encouraging a change of the band structures of the non-magnetic 3d transition metal element and the magnetic 3d transition metal element, preferably a composition ratio "c" of the nonmetallic element N, O, C in the magnetic compound expressed by the formula $M1_aM2_bX_c$ should be set to $22 \leq c$. However, when an added amount is too large, the non-magnetic 3d transition metal element and the magnetic 3d transition metal element are reduced relatively, and then an amount of elements to bear the spin-dependent conduction is reduced. Therefore, it is desirable that the composition ratio "c" should be set to $22 \leq c \leq 85$. In addition, in order to obtain the large spin polarizability in a situation that this element is bonded to most of the elements contained in the non-magnetic 3d transition metal element and the magnetic 3d transition metal element, the particularly high MR ratio can be obtained when the composition ratio "c" should be set to $30 \leq c \leq 75$.

When an added amount of a composition ratio "a" of the magnetic 3d transition metal element Co, Fe, Ni is too small in the magnetic compound expressed by the formula $M1_aM2_bX_c$, the bonding between the non-magnetic 3d transition metal element and the magnetic 3d transition metal element is reduced. Thus, a magnetism of the non-magnetic 3d transition metal element is weakened. However, when an added amount is too large, the composition ratio "b" of the non-magnetic 3d transition metal element and the composition ratio "c" of the nonmetallic element are reduced relatively, and then an effect of increasing the spin polarizability due to the addition of the non-magnetic 3d transition metal element and the nonmetallic element, as already described, is weakened. Therefore, it is more desirable that the composition ratio "a" should be set to $5 \leq a \leq 68$.

In the third example, as for the compositions in the magnetic compound formula $M1_aM2_bX_c$, Co was employed as M1, Cr was employed as M2, and O was employed as X. Even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

In the third example, the film structure similar to the first to fifth variations of the first example can be applied.

FOURTH EXAMPLE

Next, a magnetoresistive element of a fourth example according to the embodiment of the present invention will be explained hereunder. This fourth example is different from first example in that the material of the magnetic compound is varied. Therefore, explanation of the portions different apparently from first example will be made hereunder, but explanation of the similar portions will be omitted herein.

In the fourth example, the magnetoresistive elements are manufactured by using the magnetic compound Co—Mn—O [3 nm] as the upper pin layer 133 and the free layer 15 while changing a composition ratio of Co—Mn—O. Also, as a comparative example, the magnetoresistive element in which the conventional material $Co_{90}Fe_{10}$ [3 nm] was used as the upper pin layer 133 and the free layer 15 is also manufactured.

When the magneto-ressistive element of the fourth example is evaluated, it is confirmed that the MR ratio higher than that in the comparative example was obtained by the magnetoresistive element that was manufactured at the Co—Mn—O composition ratio in a particular range. The reason for such improvement in the MR ratio can be considered such that the magnetic compound has the high spin polarizability by attaining a proper composition ratio.

In the fourth example, the magnetoresistive elements having the composition ratio given in the composition formula expressed by $Co_aMn_bO_c$ shown in following Table 4 are manufactured. (Here, "a", "b", "c" are an atomic percent [at %].) In Table 4, remarks indicating whether the MR ratio is improved in each composition rather than the comparative example or not are shown together.

TABLE 4

| sample No. | Magnetic Material | Improvement in MR ratio to Comparative Example |
|---|---|---|
| (Comp. Example) A00 | $Co_{90}Fe_{10}$ | — |

TABLE 4-continued

| sample No. | Magnetic Material | Improvement in MR ratio to Comparative Example |
|---|---|---|
| D01 | $Co_{69}Mn_{10}O_{21}$ | not improved |
| D02 | $Co_{68}Mn_{10}O_{22}$ | improved |
| D03 | $Co_{60}Mn_{10}O_{30}$ | particularly improved |
| D04 | $Co_{40}Mn_{10}O_{50}$ | particularly improved |
| D05 | $Co_{15}Mn_{10}O_{75}$ | particularly improved |
| D06 | $Co_{5}Mn_{10}O_{85}$ | improved |
| D07 | $Co_{4}Mn_{10}O_{86}$ | not improved |
| D08 | $Co_{69}Mn_{9}O_{22}$ | not improved |
| D09 | $Co_{5}Mn_{73}O_{22}$ | improved |
| D10 | $Co_{4}Mn_{74}O_{22}$ | not improved |
| D11 | $Co_{4}Mn_{66}O_{30}$ | not improved |
| D12 | $Co_{4}Mn_{30}O_{66}$ | not improved |
| D13 | $Co_{5}Mn_{65}O_{30}$ | particularly improved |
| D14 | $Co_{10}Mn_{50}O_{40}$ | particularly improved |
| D15 | $Co_{30}Mn_{30}O_{40}$ | particularly improved |
| D16 | $Co_{20}Mn_{20}O_{60}$ | particularly improved |

The MR ratio of the comparative example A00 is 0.6%. It is confirmed that the magnetoresistive element manufactured in ranges of $5 \leq a \leq 68$, $10 \leq b \leq 73$, and $22 \leq c \leq 85$ has the MR ratio of 1% or more, which exceeds the comparative example. Also, the particularly high MR ratio in excess of 15% was confirmed in the magnetoresistive element manufactured in the range of $30 \leq c \leq 75$ among the above ranges. Thus, improvement in the MR ratio due to use of the magnetic compound is particularly remarkably noticed.

When an added amount of a composition ratio "b" of the non-magnetic 3d transition metal element Ti, V, Cr, Mn is too small in the magnetic compound expressed by the formula $M1_aM2_bX_c$, a contribution of the non-magnetic 3d transition metal element to the spin-dependent conduction is reduced. Therefore, it is preferable that the composition ratio "b" should be set to $10 \leq b$. However, when an added amount is too large, the magnetic 3d transition metal element is reduced relatively, and the bonding between the non-magnetic 3d transition metal element and the magnetic 3d transition metal element is reduced. Thus, a magnetism of the non-magnetic 3d transition metal element is weakened. Therefore, it is more preferable that the composition ratio "b" should be set to $10 \leq b \leq 73$.

In order to obtain an effect of encouraging a change of the band structures of the non-magnetic 3d transition metal element and the magnetic 3d transition metal element, preferably a composition ratio "c" of the nonmetallic element N, O, C in the magnetic compound expressed by the formula $M1_aM2_bX_c$ should be set to $22 \leq c$. However, when an added amount is too large, the non-magnetic 3d transition metal element and the magnetic 3d transition metal element are reduced relatively, and then an amount of elements to bear the spin-dependent conduction is reduced. Therefore, it is desirable that the composition ratio "c" should be set to $22 \leq c \leq 85$. In addition, in order to obtain the large spin polarizability in a situation that this element is bonded to most of the elements contained in the non-magnetic 3d transition metal element and the magnetic 3d transition metal element, the particularly high MR ratio can be obtained when the composition ratio "c" should be set to $30 \leq c \leq 75$.

When an added amount of a composition ratio "a" of the magnetic 3d transition metal element Co, Fe, Ni is too small in the magnetic compound expressed by the formula $M1_aM2_bX_c$, the bonding between the non-magnetic 3d transition metal element and the magnetic 3d transition metal element is reduced. Thus, a magnetism of the non-magnetic 3d transition metal element is weakened. However, when an added amount is too large, the composition ratio "b" of the non-magnetic 3d transition metal element and the composition ratio "c" of the nonmetallic element are reduced relatively, and then an effect of increasing the spin polarizability due to the addition of the non-magnetic 3d transition metal element and the nonmetallic element, as already described, is weakened. Therefore, it is more desirable that the composition ratio "a" should be set to $5 \leq a \leq 68$.

In the fourth example, as for the compositions in the magnetic compound formula $M1_aM2_bX_c$, Co is employed as M1, Cr is employed as M2, and O is employed as X. Even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

In the fourth example, the film structure similar to the first to fifth variations of the first example can be applied.

FIFTH EXAMPLE

In the magnetoresistive elements shown in the first to fourth examples, the spacer layer 14 is made of Cu. Here, it was examined whether or not the advantages of the present invention can be achieved in the magnetoresistive element having a resistance adjusting layer as the spacer layer 14. A resistance adjusting layer 142 used herein is NOL (Nano Oxide Layer) made of Al—O having metal paths formed of Cu. A Cu metal path passes through Al—O as an insulating layer, and ohmic-connects the magnetization free layer and the magnetization pinning layer.

Figure 7:
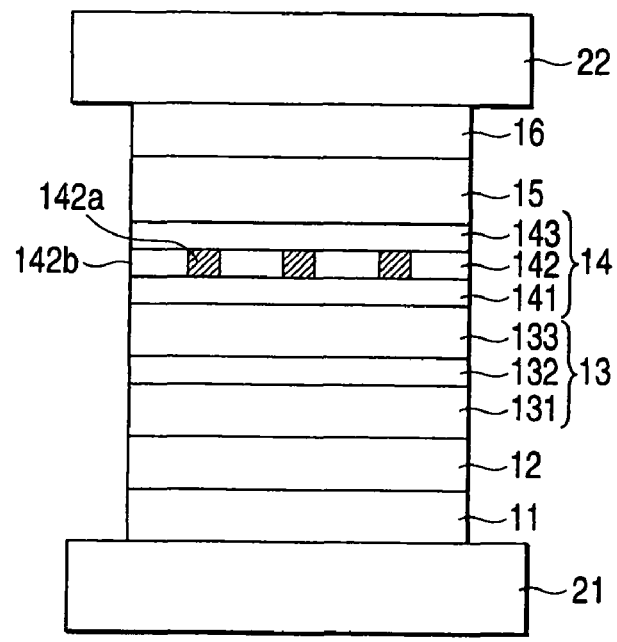
FIG. 7 is a sectional view of a magnetoresistive film of a fifth example according to the embodiment of the present invention.

A magnetoresistive element of the fifth example is shown in FIG. 7. The magnetoresistive element of the fifth example includes the lower electrode 21, the under layer 11, the pinning layer 12, the pin layer 13, the spacer layer 14, the free layer 15, the cap layer 16, and the upper electrode 22, which are formed sequentially from the bottom on the substrate. In the fifth example, the synthetic spin valve structure is employed, and the magnetic compound layer expressed by the formula $M1_aM2_bX_c$ is employed as the upper pin layer 133 of the pin layer 13 located on the spacer side and the free layer 15.

The spacer layer 14 includes a metal layer 141, the resistance adjusting layer 142, and a metal layer 143. The resistance adjusting layer 142 is NOL (Nano Oxide Layer) formed of an insulating layer 142b made of Al—O and having metal paths 142a made of Cu therein. The insulating layer 142b of the resistance adjusting layer 142 may be formed of Si, Mg, Ta, Ti, Zr, Zn, or the like or an oxide of an alloy containing these elements as a main component, except Al—O. Also, the insulating layer converted from the oxidized metal layer is not limited to the oxide, and nitride or oxanitride may be employed. As the material of the metal path 142a of the resistance adjusting layer 142, the material that is hard to be oxidized and has a low specific resistance is desirable, and Cu, Au, Ag, or the like can be employed.

The metal layer 141 acts as a supply source of the metal path 142a in forming the resistance adjusting layer 142, and has a function as a barrier layer for preventing such a situation that the underlying pin layer 13 comes into contact with the oxide of the resistance adjusting layer 142 and is excessively oxidized. Therefore, the material that is hard to be oxidized and has a low specific resistance is desirable, and Cu, Au, Ag, or the like can be employed.

The metal layer 143 has a function as a barrier layer for preventing such a situation that the overlying free layer 15 comes into contact with the oxide of the resistance adjusting layer 142 and is excessively oxidized, and Cu, Au, Ag, or the like can be employed.

In the fifth example, constituent elements except the spacer layer 14 are similar to those in the first example, and the magnetoresistive elements are manufactured by using the magnetic compound Co—Ti—O [3 nm] as the upper pin layer 133 and the free layer 15 while changing a composition ratio of Co—Ti—O. Also, as a comparative example, the magnetoresistive element in which the conventional material $Co_{90}Fe_{10}$ [3 nm] was used as the upper pin layer 133 and the free layer 15 is also manufactured.

When the magnetoresistive elements according to the fifth example are evaluated, it is confirmed that the MR ratio higher than that in the comparative example is obtained by the magnetoresistive element that is manufactured at the Co—Ti—O composition ratio in a particular range. The reason for such improvement in the MR ratio can be considered such that the magnetic compound has the high spin polarizability by attaining a proper composition ratio.

In the fifth example, the magnetoresistive elements having the composition ratio given in the composition formula expressed by $CO_aTi_bO_c$ shown in following Table 5 are manufactured. (Here, "a", "b", "c" are an atomic percent [at %].) In Table 5, remarks indicating whether the MR ratio is improved in each composition rather than comparative example or not is shown together.

TABLE 5

| sample No. | Magnetic Material | Improvement in MR ratio to Comparative Example |
|---|---|---|
| (Comp. Example) A00 | $Co_{90}Fe_{10}$ | — |
| E01 | $Co_{69}Ti_{10}O_{21}$ | not improved |
| E02 | $Co_{68}Ti_{10}O_{22}$ | improved |
| E03 | $Co_{60}Ti_{10}O_{30}$ | particularly improved |
| E04 | $Co_{40}Ti_{10}O_{50}$ | particularly improved |
| E05 | $Co_{15}Ti_{10}O_{75}$ | particularly improved |
| E06 | $Co_5Ti_{10}O_{85}$ | improved |
| E07 | $Co_4Ti_{10}O_{86}$ | not improved |
| E08 | $Co_{69}Ti_9O_{22}$ | not improved |
| E09 | $Co_5Ti_{73}O_{22}$ | improved |
| E10 | $Co_4Ti_{74}O_{22}$ | not improved |
| E11 | $Co_4Ti_{66}O_{30}$ | not improved |
| E12 | $Co_4Ti_{30}O_{66}$ | not improved |
| E13 | $Co_5Ti_{65}O_{30}$ | particularly improved |
| E14 | $Co_{10}Ti_{50}O_{40}$ | particularly improved |
| E15 | $Co_{30}Ti_{30}O_{40}$ | particularly improved |
| E16 | $Co_{20}Ti_{20}O_{60}$ | particularly improved |

The MR ratio of the comparative example A00 is 5%. It is confirmed that the magnetoresistive element manufactured in ranges of $5 \leq a \leq 68$, $10 \leq b \leq 73$, and $22 \leq c \leq 85$ has the MR ratio of 6% or more, which exceeds the comparative example. Also, the particularly high MR ratio in excess of 20% is confirmed in the magnetoresistive element manufactured in the range of $30 \leq c \leq 75$ among the above ranges. Thus, improvement in the MR ratio due to use of the magnetic compound is particularly remarkably noticed.

With the above, in the magnetoresistive element having the spacer layer 14 with the Al—O NOL structure having the Cu metal paths, the advantage for improving the MR ratio by employing the magnetic compound M1-M2-X of the present invention can be still maintained.

When an added amount of a composition ratio "b" of the non-magnetic 3d transition metal element Ti, V, Cr, Mn is too small in the magnetic compound expressed by the formula $M1_aM2_bX_c$, a contribution of the non-magnetic 3d transition metal element to the spin-dependent conduction is reduced. Therefore, it is preferable that the composition ratio "b" should be set to $10 \leq b$. However, when an added amount is too large, the magnetic 3d transition metal element is reduced relatively, and the bonding between the non-magnetic 3d transition metal element and the magnetic 3d transition metal element is reduced. Thus, a magnetism of the non-magnetic 3d transition metal element is weakened. Therefore, it is more preferable that the composition ratio "b" should be set to $10 \leq b \leq 73$.

In order to obtain an effect of encouraging a change of the band structures of the non-magnetic 3d transition metal element and the magnetic 3d transition metal element, preferably a composition ratio "c" of the nonmetallic element N, O, C in the magnetic compound expressed by the formula $M1_aM2_bX_c$ should be set to $22 \leq c$. However, when an added amount is too large, the non-magnetic 3d transition metal element and the magnetic 3d transition metal element are reduced relatively, and then an amount of elements to bear the spin-dependent conduction is reduced. Therefore, it is desirable that the composition ratio "c" should be set to $22 \leq c \leq 85$. In addition, in order to obtain the large spin polarizability in a situation that this element is bonded to most of the elements contained in the non-magnetic 3d transition metal element and the magnetic 3d transition metal element, the particularly high MR ratio can be obtained when the composition ratio "c" should be set to $30 \leq c \leq 75$.

When an added amount of a composition ratio "a" of the magnetic 3d transition metal element Co, Fe, Ni is too small in the magnetic compound expressed by the formula $M1_aM2_bX_c$, the bonding between the non-magnetic 3d transition metal element and the magnetic 3d transition metal element is reduced. Thus, a magnetism of the non-magnetic 3d transition metal element is weakened. However, when an added amount is too large, the composition ratio "b" of the non-magnetic 3d transition metal element and the composition ratio "c" of the nonmetallic element are reduced relatively, and then an effect of increasing the spin polarizability due to the addition of the non-magnetic 3d transition metal element and the nonmetallic element, as already described, is weakened. Therefore, it is more desirable that the composition ratio "a" should be set to $5 \leq a \leq 68$.

In the fifth example, as for the compositions in the magnetic compound formula $M1_aM2_bX_c$, Co is employed as M1, Cr is employed as M2, and O is employed as X. Even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

Sixth Variation: Spacer Layer is CCP-NOL and Free Layer has Stacked Structure

Figure 8:
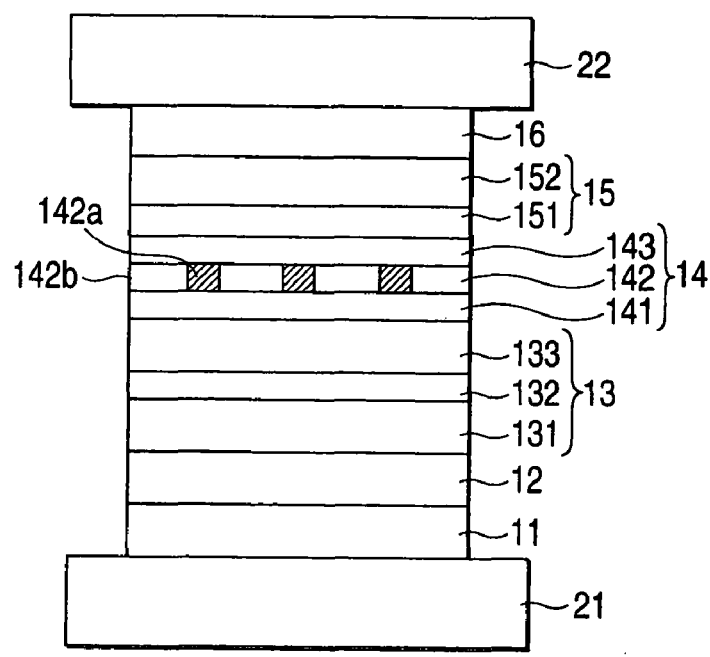
FIG. 8 is a sectional view of a magnetoresistive film according to a first variation of the fifth example.

As a variation (sixth variation) of the fifth example shown in FIG. 7, a magnetoresistive element in which the resistance adjusting layer 142 is used as the spacer layer 14 and a stacked structure composed of the magnetic compound layer and the ferromagnetic thin film layer is used as the free layer is shown in FIG. 8.

In FIG. 8, the magnetoresistive element of the sixth variation includes the lower electrode 21, the under layer 11, the pinning layer 12, the pin layer 13, the spacer layer 14, the free layer 15, the cap layer 16, and the upper electrode 22, which are formed sequentially from the bottom on the substrate. In the sixth variation, the free layer 15 is formed as the stacked structure composed of the lower free layer 151 and the upper free layer 152. Also, in the sixth variation, the synthetic spin valve structure is employed, and the magnetic compound layer M1-M2-X is employed as the upper pin layer 133 of the pin layer 13 located on the spacer side and the lower free layer 151.

When a soft magnetic film that is superior in the soft magnetic characteristic to the magnetic compound layer is employed as the ferromagnetic thin film layer used as the upper free layer 152, a magnetic field responsibility can be improved. A NiFe alloy can be employed as the material of the ferromagnetic thin film layer used as the upper free layer 152. $Ni_xFe_{100-x}$ (x=about 78 to 85) is preferable as the composition of the NiFe alloy, and about 2 to 5 nm is preferable as a film thickness of the NiFe layer. When the NiFe layer is not employed, the free layer obtained by stacking a CoFe layer or a Fe layer of 1 nm to 2 nm thickness and a very thin Cu layer of about 0.1 nm to 0.8 nm thickness in plural alternately may be employed. Also, $Co_{90}Fe_{10}$ whose soft magnetic characteristic is particularly stable out of the CoFe alloy may be employed. When the CoFe alloy similar to $Co_{90}Fe_{10}$ is employed, preferably a film thickness should be set to 0.5 nm to 4 nm. When the CoFe alloy having other composition is employed, preferably a film thickness should be set to 0.5 nm to 2 nm to maintain the soft magnetic characteristic.

In the sixth variation, since the resistance adjusting layer 142 is used as the spacer layer 14 and a current is constricted near the metal paths 142a, a spin-dependent scattering effect is increased in the lower free layer 151 of the free layer 15 rather than the upper free layer 152. Therefore, in case the resistance adjusting layer 142 is used as the spacer layer 14 and the stacked type layer is used as the free layer, it is desirable that the magnetic compound M1-M2-X as the material whose spin-dependent scattering effect is large should be arranged as the lower free layer 151.

However, in the following case, the ferromagnetic thin film layer may be employed as the lower free layer 151 and the magnetic compound layer M1-M2-X may be employed as the upper free layer 152. In case the spin-dependent scattering of the magnetic compound is considered separately as the bulk scattering and the interface scattering, in some cases such a situation is caused depending on the method of manufacturing the magnetic compound layer M1-M2-X that the spin-dependent bulk scattering becomes higher than the conventional ferromagnetic material used as the ferromagnetic thin film layer and the spin-dependent interface scattering becomes lower than the conventional ferromagnetic material used as the ferromagnetic thin film layer. In such case, the ferromagnetic thin film layer may be employed as the lower free layer 151 and the magnetic compound layer M1-M2-X may be employed as the upper free layer 152. Only the spin-dependent bulk scattering effect of the magnetic compound layer is utilized effectively by arranging the ferromagnetic thin film layer on the spacer layer interface, so that the high MR ratio can be obtained. Also, in the sixth example, the two-layered stacked structure composed of the magnetic compound layer and the ferromagnetic thin film layer is employed, but the three-layered stacked structure composed of the ferromagnetic thin film layer/magnetic compound layer/ferromagnetic thin film layer, or the like may be employed.

Similar to the first example, Co—Ti—O can be employed as the magnetic compound M1-M2-X. In the sixth variation, the similar advantages to those in the first example can be obtained. As for the compositions in the magnetic compound M1-M2-X, even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

In the sixth variation, a single layer of the magnetic compound M1-M2-X is employed as the pin layer, but the conventional material may be employed. Also, in combination with a seventh variation described hereunder, both magnetic layers of the free layer and the pin layer may be formed as the stacked structure composed of the magnetic compound layer and the ferromagnetic thin film layer.

Seventh Variation: The Spacer Layer is CCP-NOL and Pin Layer has Stacked Structure As a variation (seventh variation) of the fifth example shown in FIG. 7, a magnetoresistive element in which the resistance adjusting layer 142 is used as the spacer layer 14 and a stacked structure composed of the magnetic compound layer and the ferromagnetic thin film layer is used as the pin layer is shown in FIG. 9.

Figure 9:
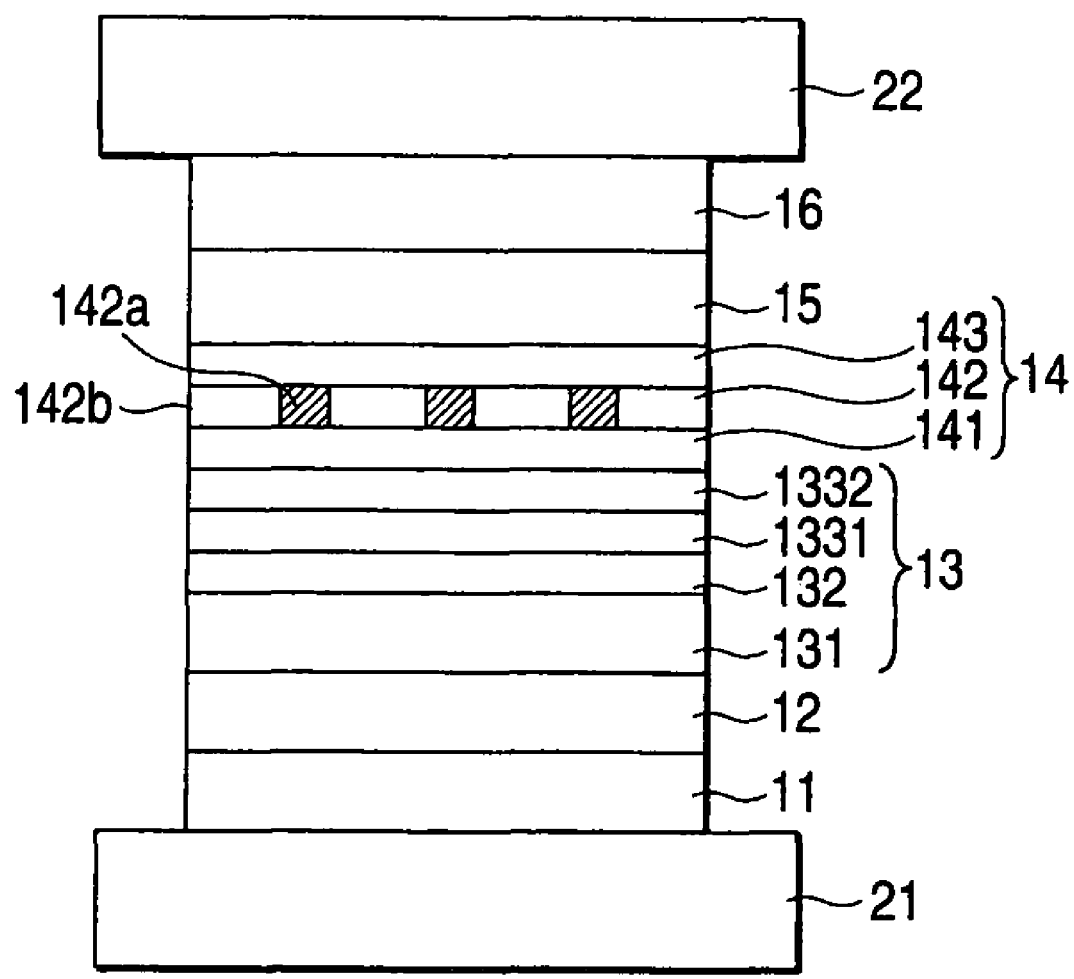
FIG. 9 is a sectional view of a magnetoresistive film according to a second variation of the fifth example.

In FIG.9, the magnetoresistive element of the seventh variation includes the lower electrode 21, the under layer 11, the pinning layer 12, the pin layer 13, the spacer layer 14, the free layer 15, the cap layer 16, and the upper electrode 22, which are formed sequentially from the bottom on the substrate. In the seventh variation, the synthetic spin valve structure is employed, and a stacked film composed of the upper pin layer lower layer 1331 and the upper pin layer upper layer 1332 is used as the upper pin layer 133 of the pin layer 13 located on the spacer side and the magnetic compound layer expressed by the formula $M1_aM2_bX_c$ is employed as the upper pin layer upper layer 1332 and the free layer 15.

When the material that can be pinned more easily in one direction than the magnetic compound is employed as the ferromagnetic thin film layer used as the upper pin layer lower layer 1331, the pin characteristic can be improved. As the ferromagnetic thin film layer material used as the upper pin layer lower layer 1331, a single metal such as Co, Fe, Ni, or the like or all alloy materials containing any one element of these elements can be employed.

In the seventh variation, since the resistance adjusting layer 142 is used as the spacer layer 14 and a current is constricted near the metal paths 142a, a spin-dependent scattering effect is increased in the upper pin layer upper layer 1332 of the upper pin layer rather than the upper pin layer lower layer 1331. Therefore, in case the resistance adjusting layer 142 is used as the spacer layer 14 and the stacked type layer is used as the pin layer, it is desirable that the magnetic compound M1-M2-X as the material whose spin-dependent scattering effect is large should be arranged as the upper pin layer upper layer 1332.

That is, from a viewpoint of the pin characteristic and a viewpoint of the MR ratio, it is desirable that the magnetic compound M1-M2-X should be arranged as the upper pin layer upper layer 1332.

However, in the following case, the three-layered stacked structure composed of the ferromagnetic thin film layer/magnetic compound layer/ferromagnetic thin film layer, or the more may be employed. In case the spin-dependent scattering of the magnetic compound is considered separately as the bulk scattering and the interface scattering, in some cases such a situation is caused depending on the method of manufacturing the magnetic compound layer M1-M2-X that the spin-dependent bulk scattering becomes higher than the conventional ferromagnetic material used as the ferromagnetic thin film layer and the spin-dependent interface scattering becomes lower than the conventional ferromagnetic material used as the ferromagnetic thin film layer. In such case, only the spin-dependent bulk scattering effect of the magnetic compound layer is utilized effectively by arranging the ferromagnetic thin film layer on the spacer layer interface, so that the high MR ratio can be obtained.

Similar to the first example, Co—Ti—O can be employed as the magnetic compound M1-M2-X. In the seventh variation, the similar advantages to those in the first example can be obtained. As for the compositions in the magnetic compound M1-M2-X, even when at least one type of magnetic 3d transition metal elements selected from Co, Fe, Ni is employed as M1, the similar advantages can be obtained. Even when at least one type of non-magnetic 3d transition metal elements selected from Ti, V, Cr, Mn is employed as M2, the similar advantages can be obtained. Even when at least one type of nonmetallic elements selected from N, O, C is employed as X, the similar advantages can be obtained.

In the seventh variation, a single layer of the magnetic compound M1-M2-X is employed as the free layer, but the conventional material may be employed. Also, in combination with sixth variation, both magnetic layers of the free layer and the pin layer may be formed as the stacked type.

Hereinafter, applications of the magnetoresistive element according to the embodiment of the present invention will be explained hereunder.

In the embodiment of the present invention, an element resistance RA of the magnetoresistive element should be set preferably to 500 mΩ/μm2 or less from a viewpoint of the high density compatibility, and more preferably to 300 mΩ/μm2. The element resistance RA is calculated by multiplying an element resistance R of the CPP element by an effective area A of a current feeding portion of the spin valve film. Here, the element resistance R can be measured directly. In contrast, since the effective area A of the current feeding portion of the spin valve film is a value that depends upon an element structure, care must be taken in deciding the effective area A.

For example, when the overall spin valve film is patterned as an effective sensing area, an area of the overall spin valve film corresponds to the effective area A. In this case, from a viewpoint that the element resistance should be set adequately, the area of the spin valve film should be set to at least 0.04 μm² or less, and should be set to 0.02 μm² or less when a recording density is set to 200 Gbpsi or more.

However, when a lower electrode or an upper electrode whose area is smaller than the spin valve film is formed to contact the spin valve film, the area of the lower electrode or the upper electrode corresponds to the effective area A of the spin valve film. When the areas of the lower electrode and the upper electrode are different respectively, the smaller area of the electrode corresponds to the effective area A of the spin valve film. In this case, from a viewpoint that the element resistance should be set adequately, the smaller area of the electrode should be set to at least 0.04 μm²or less.

In the case of examples shown in FIG. 10 and FIG. 11, which will be described later, because the smallest area of the spin valve film 10 in FIG. 10 corresponds to the portion that contacts the upper electrode 251, this width is considered as a track width Tw. Also, because the portion that contacts the upper electrode 251 is also smallest in height in FIG. 11, this width is considered as a height length D. The effective area A of the spin valve film is considered like A=Tw×D.

In the magnetoresistive element according to the embodiment of the present invention, the resistance R between the electrodes can be reduced to 100 Ω or less. This resistance R is a resistance value that is measured between two electrode pads of a playback head portion fitted to a top end of a head gimbal assembly (HGA), for example.

Magnetic Head

Figure 10:
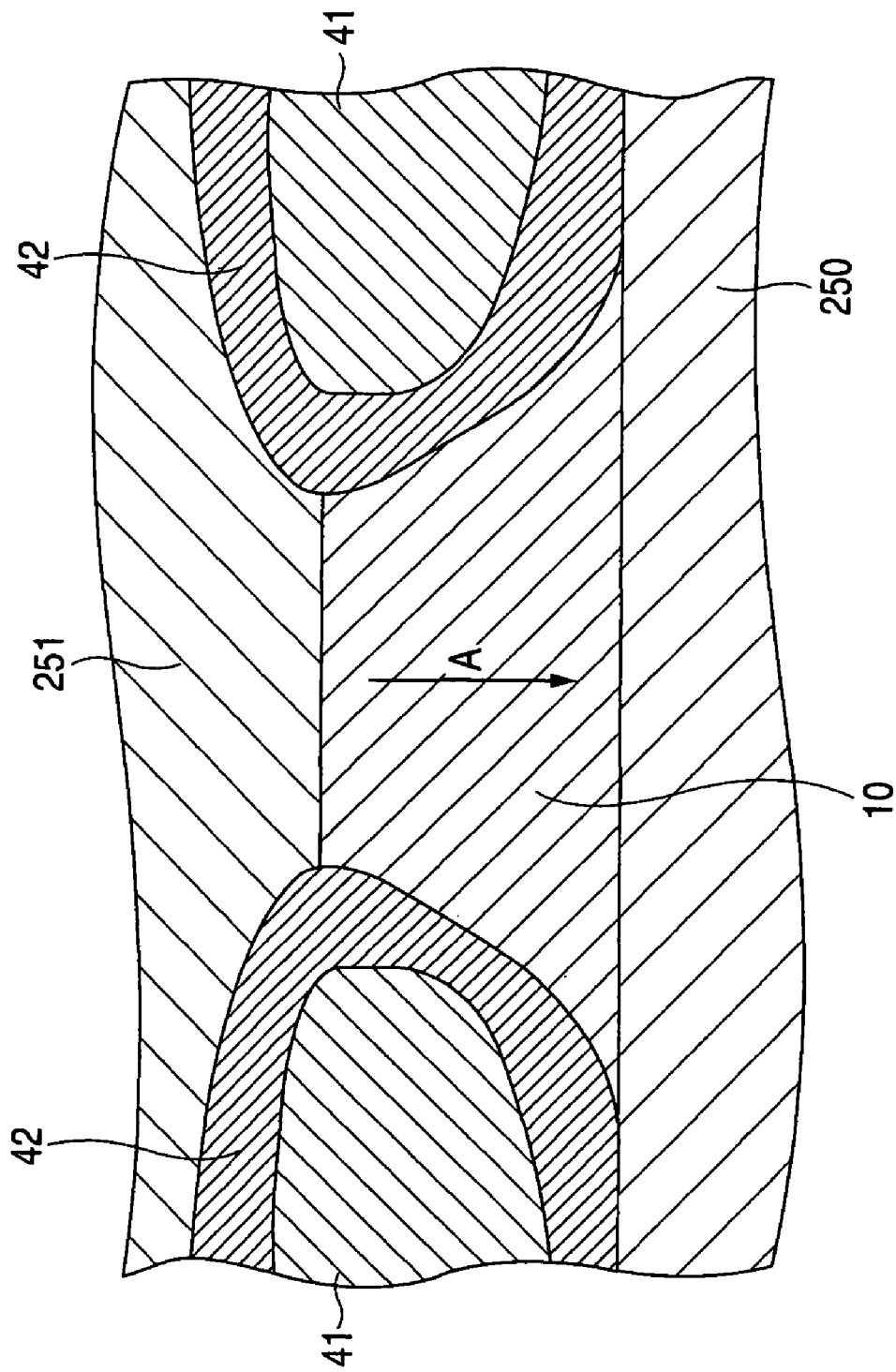
FIG. 10 is a view showing a state that the magnetoresistive element according to the embodiment is incorporated into a magnetic head.
Figure 11:
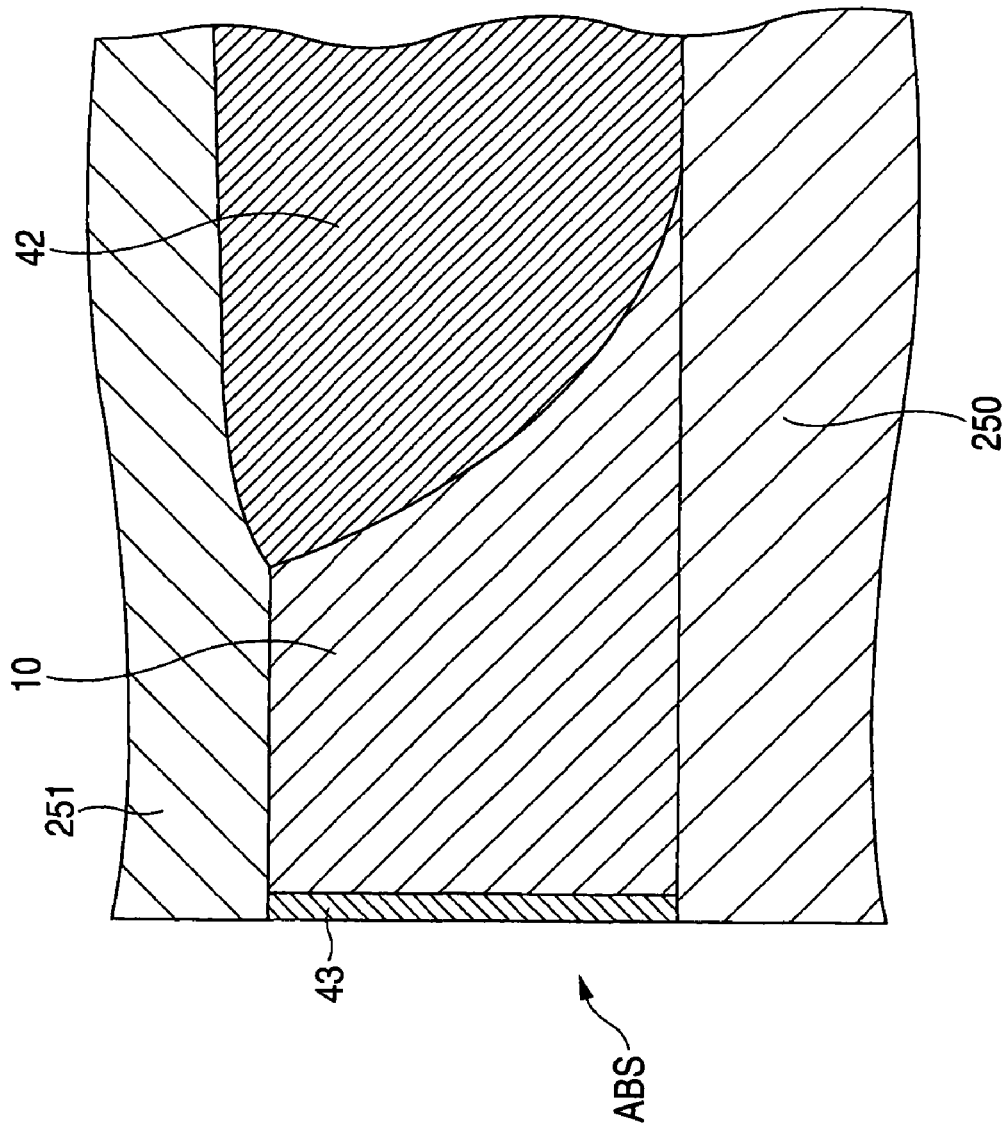
FIG. 11 is a view showing similarly a state that the magneto-resistive element according to the embodiment is incorporated into the magnetic head.

FIG. 10 and FIG. 11 show a state that the magnetoresistive element according to the embodiment of the present invention is incorporated into the magnetic head. FIG. 10 is a sectional view when the magnetoresistive element is cut along the almost parallel direction to the medium facing surface that opposes to the magnetic recording medium (not shown). FIG. 11 is a sectional view when the magnetoresistive element is cut along the perpendicular direction to the medium facing surface ABS.

The magnetic head shown in FIG. 10 and FIG. 11 has the so-called hard abutted structure. A magnetoresistive film 10 is the magnetoresistive film described above. The lower electrode 250 and the upper electrode 251 are provided on and under the magnetoresistive film 10 respectively. In FIG. 10, a bias magnetic field applying film 41 and an insulating film 42 are stacked and provided on both side surfaces of the magnetoresistive film 10. As shown in FIG.11, a protection layer 43 is provided on the medium facing surface of the magnetoresistive film 10.

A sense current applied to the magnetoresistive film 10 is fed in the direction almost perpendicular to the film surface by the lower electrode 250 and the upper electrode 251 arranged under and on the magnetoresistive film 10, as indicated with an arrow A. Also, a bias magnetic field is applied to the magneto- resistive film 10 by a pair of bias magnetic field applying films 41, 41 provided on the right and left sides. The magnetic anisotropy of the free layer of the magnetoresistive film 10 is controlled by the bias magnetic field to obtain the single domain, so that the magnetic domain structure can be stabilized and a Barkhausen noise generated due to movement of magnetic walls can be suppressed.

Since an S/N ratio of the magnetoresistive film 10 is improved, a high sensitivity magnetic playback can be realized when this magnetoresistive film is applied to the magnetic head.

Hard Disk and Head Gimbal Assembly

The magnetic head shown in FIG. 10 and FIG. 11 can be incorporated into the magnetic recording/reproducing apparatus when it is installed into the recording/playing integrated magnetic head assembly.

Figure 12:
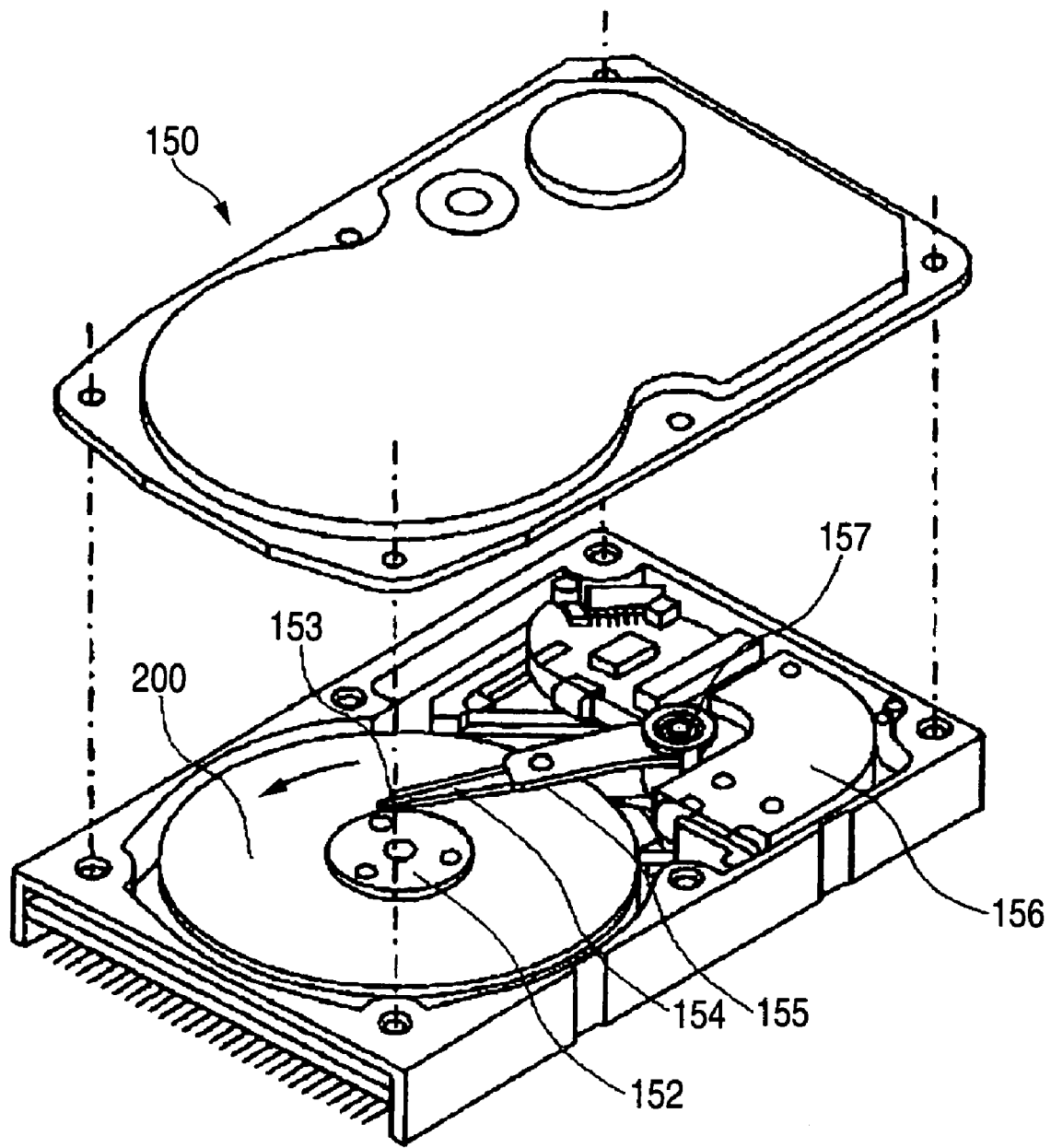
FIG. 12 is a pertinent perspective view showing a schematic configuration of a magnetic recording/reproducing apparatus.

FIG. 12 is a pertinent perspective view showing a schematic configuration of such magnetic recording/reproducing apparatus. That is, a magnetic recording/reproducing apparatus 150 of the present embodiment is the device of the type using a rotary actuator. In FIG. 12, a magnetic disk 200, which serves as a magnetic recording medium, is fitted to a spindle 152 and is turned in the arrow A direction by a motor (not shown) that responds to a control signal fed from a driving unit controlling portion (not shown). The magnetic recording/reproducing apparatus 150 of the present embodiment may be equipped with a plurality of magnetic disks 200.

A head slider 153 for recording/reproducing the information stored in the magnetic disk 200 is fitted to a top end of a thin film-like suspension 154. The magnetic head containing the magnetoresistive element according to any one of embodiments is mounted near the top end of the head slider 153.

When the magnetic disk 200 is turned, the medium facing surface (ABS) of the head slider 153 is held at a predetermined floating height from a surface of the magnetic disk 200. Otherwise, a so-called contact-type slider that contacts the magnetic disk 200 may be employed.

The suspension 154 is connected to one end of an actuator arm 155. A voice coil motor 156 as one type of linear motor is provided to the other end of the actuator arm 155. The voice coil motor 156 includes a driving coil (not shown) wound in a bobbin portion, and a magnetic circuit that consists of a permanent magnet and an opposing yoke opposed to put the coil therebetween.

The actuator arm 155 is held by ball bearings (not shown) provided to upper and lower portions of a spindle 157, and can be turned/slid by the voice coil motor 156.

Figure 13:
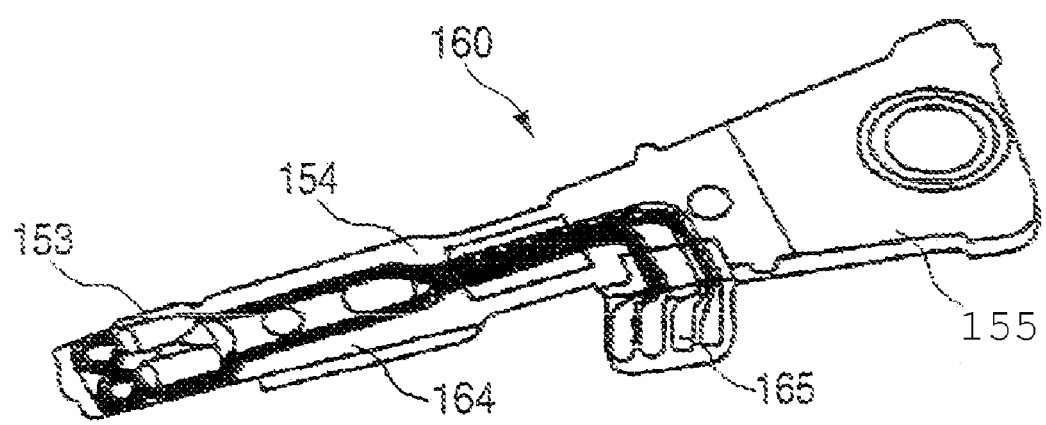
FIG. 13 is an enlarged perspective view showing a head gimbal assembly ahead of an actuator arm when viewed from a disk side.

FIG. 13 is an enlarged perspective view when the head gimbal assembly position ahead of the actuator arm 155 is viewed from the disk side. That is, an assembly 160 has the actuator arm 155, and the suspension 154 is connected to one end of the actuator arm 155. The head slider 153 having the magnetic head containing the magnetoresistive element according to any one of the above embodiments is fitted to a top end of the suspension 154. The suspension 154 has lead wires 164 used to write and read the signal, and the lead wires 164 and respective electrodes of the magnetic head incorporated into the head slider 153 are connected electrically to each other. In FIG. 13, 165 denotes an electrode pad.

According to thus described configuration, since the magnetic head including the foregoing magnetoresistive element is equipped, the information recorded magnetically on the magnetic disk 200 can be read at high recording density without fail.

Magnetic Memory

Next, the magnetic memory into which the magnetoresistive element according to the embodiment of the present invention is incorporated will be explained hereunder.

The magnetic memory such as the magnetic random access memory (MRAM) in which memory cells are arranged in a matrix fashion, for example, and the like can be implemented by using the magnetoresistive element according to the embodiment of the present invention.

Figure 14:
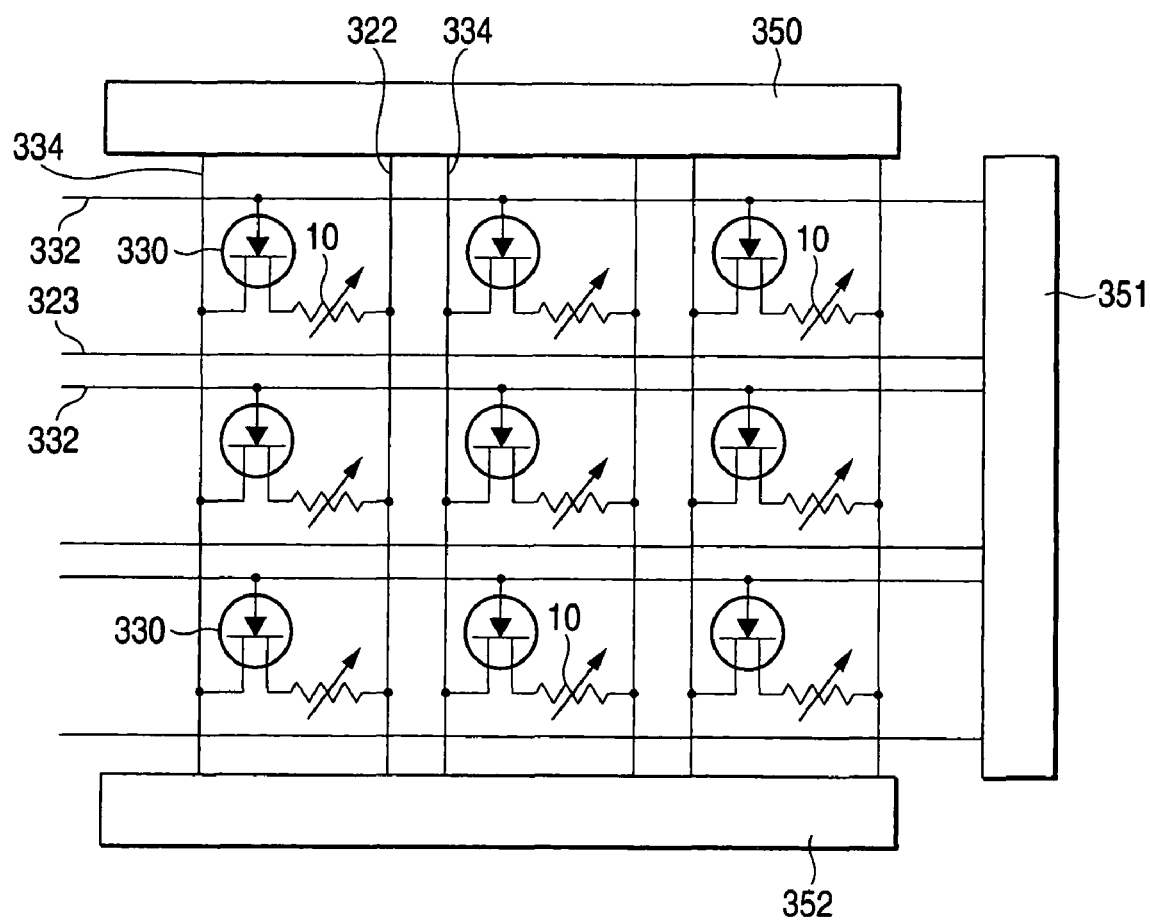
FIG. 14 is a view showing an example of a matrix arrangement of a magnetic memory according to the embodiment.

FIG. 14 is a view showing an example of a matrix arrangement of the magnetic memory according to the embodiment of the present invention. This FIG. 14 shows a circuit configuration when the memory cells are arranged in an array fashion. A column decoder 350 and a row decoder 351 are provided to select one bit in the array. The bit information recorded in a magnetic recording layer (free layer) in the magnetoresistive film 10 can be read by selecting uniquely a switching transistor 330, which is to be turned ON, via a bit line 334 and a word line 332 and then sensing the transistor by a sense current 352. When the bit information is written, the magnetic field generated by supplying a writing current to a particular writing word line 323 and a bit line 322 is applied to a particular bit.

Figure 15:
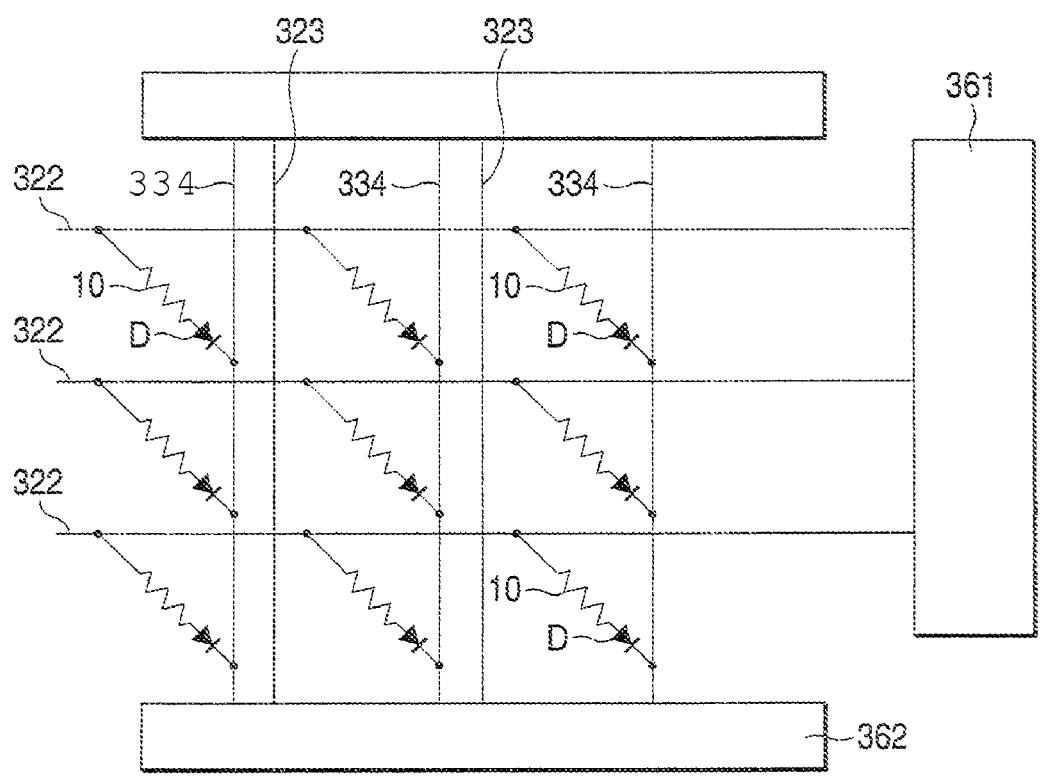
FIG. 15 is a view showing another example of a matrix arrangement of the magnetic memory according to the embodiment.

FIG. 15 is a view showing another example of a matrix arrangement of the magnetic memory according to the embodiment of the present invention. In this case, the bit line 322 and the bit line 334 wired in a matrix fashion are selected by decoders 361, 362 respectively, and a particular memory cell in the array is selected. Each memory cell has a series-connected structure of the magnetoresistive element 10 and a diode D. Here, the diode D has a function to prevent the event that the sense current detours into the memory cells except the selected magnetoresistive element 10. The writing is executed by the magnetic field generated by supplying the writing current to the particular bit line 322 and the writing word line 323.

Figure 16:
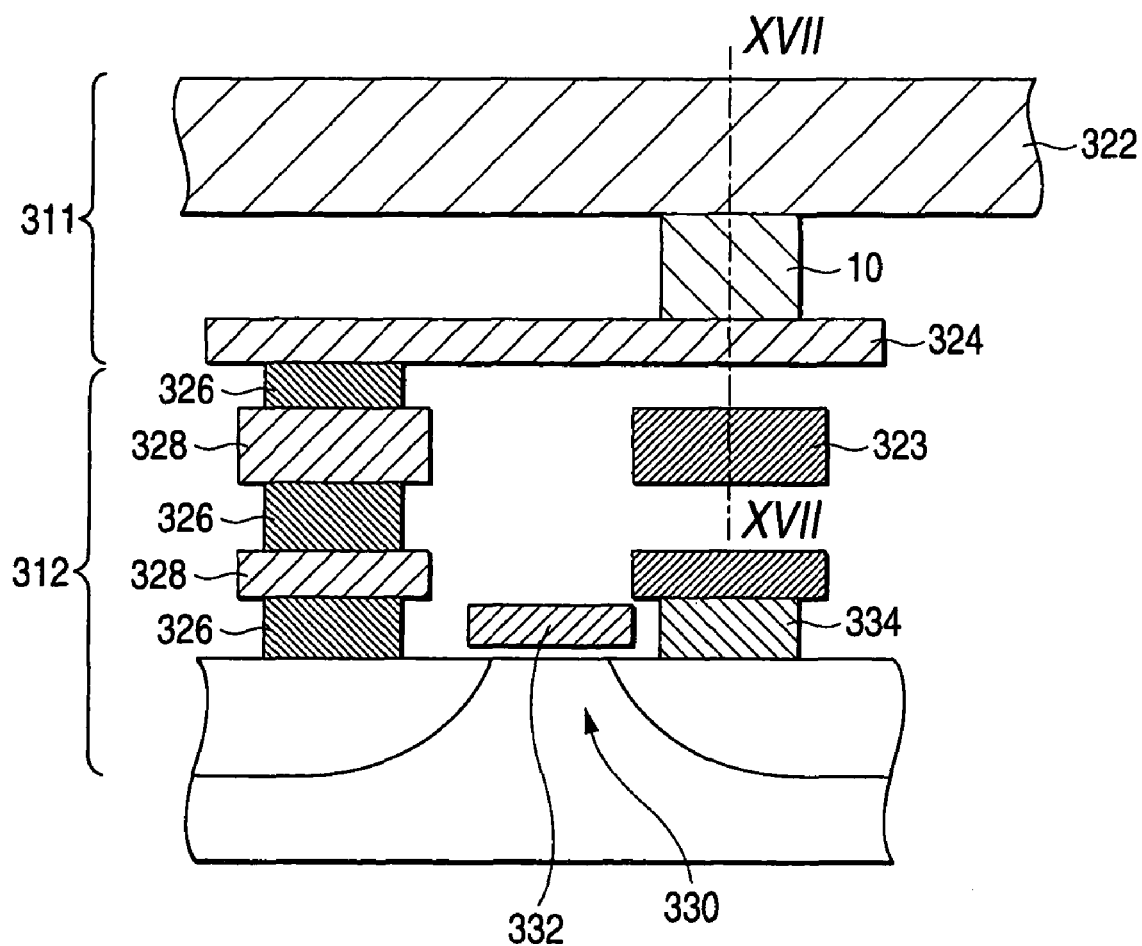
FIG. 16 is a sectional view showing a substantial part of the magnetic memory according to the embodiment.

FIG. 16 is a sectional view showing a substantial part of the magnetic memory according to the embodiment of the present invention. FIG. 17 is a sectional view taken along a XVII-XVII line shown in FIG. 16. The structure shown in these Figures corresponds to one-bit of the memory cell contained in the magnetic memory shown in FIG. 14 and FIG. 15. This memory cell has a memory element portion 311 and an address selecting transistor portion 312.

The memory element portion 311 has the magnetoresistive element 10 and a pair of wirings 322, 324 connected to this magnetoresistive element. The magnetoresistive element 10 is the magnetoresistive element according to the above embodiment.

In contrast, the switching transistor 330 connected through vias 326 and embedded wirings 328 is provided in the address selecting transistor portion 312. This switching transistor 330 executes a switching operation in response to a voltage applied to the gate 332, and controls the open/close of the current path between the magnetoresistive element 10 and the bit line 334.

Also, the writing wiring 323 is provided below the magnetoresistive element 10 in the direction almost perpendicular to the wiring 322. These writing wirings 322, 323 can be formed of aluminum (Al), copper (Cu), tungsten (W), tantalum (Ta), or an alloy containing any one of these elements, for example.

In the memory cell having such configuration, when the bit information is written into the magnetoresistive element 10, a writing pulse current is supplied to the wirings 322, 323 and then the magnetization of the recording layer of the magnetoresistive element is inverted appropriately by applying a synthesized magnetic field induced by these currents.

Also, when the bit information is read, the sense current is fed through the wiring 322, the magnetoresistive element 10 containing the magnetic recording layer, and a lower electrode 324, and a resistance value of the magnetoresistive element 10 or a change of the resistance value is measured.

Since the magnetoresistive element according the above embodiment is utilized, the magnetic memory according to the embodiment of the present invention can keep the sure writing and execute the reading surely by controlling the magnetic domain of the recording layer surely even when a cell size is miniaturized.

Other Embodiment

The embodiment of the present invention is not limited to the above described embodiment, and can be extended and varied. The extended and varied embodiments are also within the technical scope of the present invention.

Those skilled in the art can select appropriate structure of the magnetoresistive film, and shapes and materials of electrode, bias applying film, insulating film, and the like from the publicly-known ranges. Thus, the present invention can be embodied similarly and the similar advantages can be attained.

For example, when the magnetic shielding is attached on and under the element in applying the magnetoresistive element to the playback magnetic head, a sensing resolution of the magnetic head can be specified. Also, the embodiment of the present invention can be applied to the magnetic head or the magnetic reproducing device of not only the longitudinal magnetic recording system but also the vertical magnetic recording system. In addition, the magnetic reproducing device of the present invention may of the fixed type in which the particular recording medium is stably fitted, or the so-called "removable" type in which the recording medium can be exchanged.

In addition, all magnetoresistive elements, magnetic heads, magnetic storing/reproducing devices and magnetic memories, which the those skilled in the art can embody appropriately by applying a change in design based on the magnetic head and the magnetic recording/reproducing apparatus as the embodiment of the present invention, also belong to a scope of the present invention.

It is to be understood that the present invention is not limited to the above-described specific embodiment thereof and various changes, modifications, etc., may be made without departing from the spirit and the scope of the invention.

What is claimed is:

1. A magnetoresistive element comprising:
    a first magnetic layer whose magnetization direction is substantially pinned toward one direction;
    a second magnetic layer whose magnetization direction is changed in response to an external magnetic field; and
    a spacer layer provided between the first magnetic layer and the second magnetic layer,
    wherein the second magnetic layer comprises a magnetic compound layer including a magnetic compound that is expressed by $M1_aM2_bO_c$, (where $5 \leqq a \leqq 68$, $10 \leqq b \leqq 73$, and $22 \leqq c \leqq 85$),
    wherein M1 is at least one element selected from the group consisting of Co, Fe, and Ni, and
    wherein M2 is at least one element selected from the group consisting of Ti, V, Cr, and Mn.

2. The magnetoresistive element according to claim 1, wherein c satisfies $30 \leqq c \leqq 75$.

3. The magnetoresistive element according to claim 1, wherein the spacer layer is a conductor.

4. The magnetoresistive element according to claim 1, wherein the spacer layer includes an insulating layer and a conductor, and
    wherein the conductor penetrates through the insulating layer in a direction perpendicular to a film surface of the insulating layer.

5. The magnetoresistive element according to claim 1, wherein the magnetic compound has an amorphous crystal structure.

6. The magnetoresistive element according to claim 1, wherein the magnetic compound layer has a film thickness in a range from 0.5 nm to 5 nm.

7. A magnetoresistive head comprising the magnetoresistive element according to claim 1.

8. A magnetic recording/reproducing apparatus comprising:
    the magnetoresistive head according to claim 7; and
    a magnetic recording medium.

9. A magnetic memory comprising the magnetoresistive element according to claim 1.

* * * * *